(12) United States Patent
Horii et al.

(10) Patent No.: US 7,290,109 B2
(45) Date of Patent: Oct. 30, 2007

(54) MEMORY SYSTEM AND MEMORY CARD

(75) Inventors: Takashi Horii, Higashimurayama (JP); Keiichi Yoshida, Musashimurayama (JP); Atsushi Nozoe, Hino (JP)

(73) Assignee: Renesas Technology Corp., Tokyo (JP)

( * ) Notice: Subject to any disclaimer, the term of this patent is extended or adjusted under 35 U.S.C. 154(b) by 509 days.

(21) Appl. No.: 10/500,252

(22) PCT Filed: Jan. 9, 2002

(86) PCT No.: PCT/JP02/00025

§ 371 (c)(1),
(2), (4) Date: Jun. 25, 2004

(87) PCT Pub. No.: WO03/060722

PCT Pub. Date: Jul. 24, 2003

(65) Prior Publication Data

US 2005/0015539 A1    Jan. 20, 2005

(51) Int. Cl.
*G06F 12/00* (2006.01)
(52) U.S. Cl. .................. 711/168; 711/157; 711/103; 711/5
(58) Field of Classification Search ................ 711/168
See application file for complete search history.

(56) References Cited

U.S. PATENT DOCUMENTS

| | | | |
|---|---|---|---|
| 5,530,828 A | 6/1996 | Kaki et al. | |
| 5,890,192 A | 3/1999 | Lee et al. | 711/103 |
| 6,065,092 A * | 5/2000 | Roy | 711/5 |
| 6,201,735 B1 | 3/2001 | Kato et al. | |
| 6,202,138 B1 * | 3/2001 | Estakhri et al. | 711/168 |
| 6,339,817 B1 * | 1/2002 | Maesako et al. | 711/165 |
| 6,385,688 B1 * | 5/2002 | Mills et al. | 711/103 |
| 6,397,314 B1 * | 5/2002 | Estakhri et al. | 711/168 |

FOREIGN PATENT DOCUMENTS

| | | |
|---|---|---|
| JP | 6-4399 | 1/1994 |
| JP | 6-324937 | 11/1994 |
| JP | 2001-167586 | 6/2001 |
| JP | 2001-249890 | 9/2001 |
| JP | 2001-266579 | 9/2001 |
| WO | WO 01/18640 | 3/2001 |

* cited by examiner

*Primary Examiner*—Matthew Kim
*Assistant Examiner*—Ryan A. Dare
(74) *Attorney, Agent, or Firm*—Miles & Stockbridge PC

(57) ABSTRACT

A memory system includes a plurality of nonvolatile memory chips (CHP1 and CHP2) each having a plurality of memory banks (BNK1 and BNK2) which can perform a memory operation independent of each other and a memory controller (5) which can control to access each of said nonvolatile memory chips. The memory controller can selectively instruct either a simultaneous writing operation or an interleave writing operation on a plurality of memory banks of the nonvolatile memory chips. Therefore, in the simultaneous writing operation, the writing operation which is much longer than the write setup time can be performed perfectly in parallel. In the interleave writing operation, the writing operation following the write setup can be performed so as to partially overlap the writing operation on another memory bank. As a result, the number of nonvolatile memory chips constructing the memory system of the high-speed writing operation can be made relatively small.

21 Claims, 22 Drawing Sheets

FIG. 24

| COMMAND NAME | MEANING | 1st | 2nd | 3rd | 4th | 5th | 6th | 7th | Group |
|---|---|---|---|---|---|---|---|---|---|
| Serial Read (1) | NORMAL READ | 00H | SA1 | SA2 | . | . | . | . | A |
| Serial Read (2) | READ FROM MANAGEMENT REGION | F0H | SA1 | SA2 | . | . | . | . | A |
| Read Identifier Codes | READING OF ID CODE | 90H | . | . | . | . | . | . | A |
| Data Recovery Read (1) | READING OF Recovery Data AT THE TIME OF OPERATION ON ONE BNK1 | 01H | . | . | . | . | . | . | A |
| Data Recovery Read (2) | READING OF Recovery Data OF BNK1 AT THE TIME OF OPERATION ON TWO BANKS | 02H | . | . | . | . | . | . | A |
| Data Recovery Read (3) | READING OF Recovery Data OF BNK2 AT THE TIME OF OPERATION ON TWO BANKS | 03H | . | . | . | . | . | . | A |
| Sector Erase | SECTOR ERASE | 20H | SA1 | SA2 | SA1*1 | SA2*1 | B0H | . | B |
| Program (1) | NORMAL WRITE (WITH ERASE SEQUENCE) | 10H | SA1 | SA2 | 40H | SA1*2 | SA2*2 | 40H | C |
| Program (2) | NORMAL WRITE | 1FH | SA1 | SA2 | 40H | SA1*2 | SA2*2 | 40H | C |
| Program (3) | WRITE TO MANAGEMENT REGION | 0FH | SA1 | SA2 | 40H | SA1*2 | SA2*2 | 40H | C |
| Program (4) | REWRITE | 11H | SA1 | SA2 | 40H | SA1*2 | SA2*2 | 40H | C |
| Program Retry | RETRY OF WRITE | 12H | SA1*3 | SA2*3 | . | . | . | . | C |
| Clear Status Register (1) | RESET OF STATUS REGISTER FOR BNK1 AND BNK2 | 50H | . | . | . | . | . | . | D |
| Clear Status Register (2) | RESET OF STATUS REGISTER FOR BNK1 | 51H | . | . | . | . | . | . | D |
| Clear Status Register (3) | RESET OF STATUS REGISTER FOR BNK2 | 52H | . | . | . | . | . | . | D |

MEMORY SYSTEM AND MEMORY CARD

TECHNICAL FIELD

The present invention relates to a memory system and a memory card each using a plurality of chips of nonvolatile memories such as flash memories having multiple banks and relates to a technique effective when applied to a memory card such as a multimedia card.

BACKGROUND ART

A flash memory can store information in accordance with a threshold voltage changed by injecting or discharging electrons to/from a floating gate or the like of a memory cell transistor. In the specification, a state where the threshold voltage of the memory cell transistor is low will be called an erase state, and a state where the threshold voltage is high will be called a write state. In the case of storing information in accordance with write data, a high voltage is applied to a memory cell transistor in the erase state in accordance with a logic value of the write data. To obtain a desired threshold voltage in the memory cell transistor, relatively long processing time is required.

There is a conventional flash memory card on which a flash memory chip and a memory controller are mounted and which employs an interleave writing operation to achieve seemingly high speed of the writing operation. The interleave writing operation is performed in such a manner that a plurality of flash memory chips are mounted on a card board, one of the flash memory chips is instructed to perform a writing operation and, after that, another flash memory is instructed to perform a writing operation and starts the writing operation. To make writing operation time unseen by the operation, a number of flash memory chips have to be mounted. Specifically, when write setup time for supplying a write address and write data to one flash memory chip and giving an instruction to perform the writing operation is compared with time of the writing operation of writing the write data into the memory address instructed by the write setup, the writing operation time is much longer. If the write setup is sequentially made to the other flash memories so as to overlap the writing operation time, the writing operations on most of the flash memory chips can be performed partially in parallel, so that the writing operation time of many of the flash memory chips is unseen.

However, in the conventional method of performing interleave writing on the flash memory unit basis, a number of flash memory chips have to be mounted to make the writing operation time unseen, so that the size and cost of the memory card increases.

An object of the invention is to provide a memory system and, further, a memory card capable of realizing higher write speed without mounting flash memory chips of the number which is large to an extent that the size of the memory card increases or the cost increases.

The above and other objects and novel features of the invention will become apparent from the description of the specification and the appended drawings.

DISCLOSURE OF THE INVENTION

[1] A memory system according to the invention includes a plurality of nonvolatile memory chips each having a plurality of memory banks which can perform a memory operation independent of each other, and a memory controller which can control to individually access each of the nonvolatile memory chips. The memory controller can selectively instruct a simultaneous writing operation or an interleave writing operation on the plurality of memory banks in the nonvolatile memory chips.

According to the means, the simultaneous writing operation or interleave writing operation on a plurality of memory banks can be performed in units of a chip having multiple banks. In the simultaneous writing operation, the writing operation which is much longer than the write setup time can be performed perfectly in parallel. In the interleave writing operation, the writing operation following the write setup on one memory bank is sequentially performed and partially overlaps the writing operation on another memory bank, thereby performing the operations in parallel. Thus, the number of nonvolatile memory chips constructing the memory system performing the high-speed writing operation can be made relatively small.

The simultaneous writing operation is, for example, a writing operation started at the same timing on a plurality of memory banks after serial plural instructions of the writing operation designating the memory banks. The interleave writing operation is a writing operation of starting a new writing operation in response to a write instruction designating another memory bank during a writing operation which has already started.

As a desired mode of the invention, the memory controller may discriminate between an instruction of the simultaneous writing operation and an instruction of the interleave writing operation in accordance with a kind of a command code which accompanies write address information and write data information and instructs a writing operation. Although the writing operation can be also instructed by register setting, as compared with this case, a special control mode can be omitted. It is sufficient to give a write command so as to accompany the write address information and write data information.

As a preferred mode of the invention, when each of the nonvolatile memory chips has a chip select terminal and other plural access terminals, to easily obtain a connection mode in which the memory controller can access each of the plurality of nonvolatile memory chips, the memory controller has a chip select signal output terminal connected to the chip select terminal of each of the nonvolatile memory chips and a plurality of access information terminals commonly connected to the access terminals of each of the nonvolatile memory chips.

[2] A memory system according to another aspect of the invention includes a plurality of nonvolatile memory chips each having a plurality of memory banks which can perform a memory operation independent of each other, and a memory controller which can control to individually access each of the nonvolatile memory chips. The memory controller can sequentially instruct interleave writing on the memory banks in each of the nonvolatile memory chips.

The interleave writing instruction is, for example, a writing operation instruction for starting a new writing operation in response to a write instruction designating another memory bank during a writing operation already started.

According to the means, the interleave writing operation on a plurality of memory banks can be performed in units of a chip having multiple banks. In the interleave writing operation, the writing operation following the write setup on one memory bank is sequentially performed and partially overlaps the writing operation on another memory bank, thereby performing the operations in parallel. Thus, the number of nonvolatile memory chips constructing the memory system performing the high-speed writing operation can be made relatively small.

[3] A memory system according to another aspect of the invention includes a plurality of nonvolatile memory chips each having a plurality of memory banks which can perform a memory operation independent of each other, and a memory controller which can control to individually access each of the nonvolatile memory chips. The memory controller can sequentially instruct simultaneous writing on the memory banks in each of the nonvolatile memory chips.

The simultaneous writing instruction is, for example, a writing operation instruction for starting the writing operation at the same timing on a plurality of memory banks after serial plural instructions of the writing operation designating the memory banks.

According to the means, the simultaneous writing operation on a plurality of memory banks can be performed in units of a chip having multiple banks. In the simultaneous writing operation, the writing operation much longer than the write setup time can be performed perfectly in parallel. Thus, the number of nonvolatile memory chips constructing the memory system performing the high-speed writing operation can be made relatively small.

[4] A memory system according to further another aspect of the invention includes a plurality of flash memory chips each having a plurality of memory banks which can perform a memory operation independent of each other, a memory controller which can control to individually access each of the plurality of flash memory chips, and an SRAM connected to the memory controller. The SRAM can temporarily store write data to the flash memory chips. The memory controller can select an instruction of sequentially performing interleave writing on the memory banks in each of the flash memory chips or an instruction of sequentially performing simultaneous writing the memory banks in each of the flash memory chips.

In the case where the transfer speed of write data sent from a host system is faster than the speed of operation of writing data to the flash memory chip by the interleave writing or simultaneous writing, the SRAM is used as a write data buffer. In the case where the write speed is faster than the data transfer speed, it is unnecessary to use the SRAM as a write data buffer.

[5] A memory system according to further another aspect of the invention includes a plurality of flash memory chips each having a plurality of memory banks which can perform a memory operation independent of each other and a memory controller which can control to access the flash memory chip by using an access command. The memory controller outputs a first command code, address information of a memory bank subsequent to the first command code, and a second command code subsequent to the address information of the memory bank and makes a memory bank designated by the address information start a memory operation every input of the second command code. The memory controller also outputs a first command code, address information of a memory bank subsequent to the first command code, a third command code subsequent to the address information of the memory bank, address information of a memory bank subsequent to the third command code, and a second command code subsequent to the address information of the memory bank, and makes a plurality of memory banks designated by a plurality of pieces of address information separated by the third command between the first command code to the second command code simultaneously start a memory operation in response to input of the second command code. The former operation is the interleave writing operation, and the latter operation is the simultaneous writing operation.

The first command code is a command code indicative of a kind of the writing operation, the second command code is a command code for instructing start of the writing operation, and the third command code is a command code indicating that address information follows.

[6] A memory card according to the invention has, on a card board, an external connection terminal, an external interface circuit connected to the external connection terminal, a memory controller connected to the external interface circuit, and a plurality of flash memory chips each receiving an access control by the memory controller. The flash memory chip has a plurality of memory banks which can perform a memory operation independent of each other. The memory controller can selectively instruct a simultaneous writing operation or an interleave writing operation on a plurality of memory banks in the flash memory chips.

As a write data buffer, an SRAM may be mounted. In the case of applying the invention to a multimedia card or the like, the external connection terminal includes a 1-bit data input/output terminal, a 1-bit command terminal, a power source voltage terminal, a circuit's ground voltage terminal, and a clock terminal.

Also in the memory card, in a manner similar to the above, in the simultaneous writing operation, the writing operation much longer than the write setup time can be performed perfectly in parallel. In the interleave writing operation, the writing operation following the write setup of one memory bank can be performed sequentially so as to partially overlap the writing operation on another memory bank, thereby performing the operations in parallel. As a result, the number of nonvolatile memory chips required to construct a memory card of a high-speed writing process can be made relatively small, rise in cost of the memory card is suppressed, and the writing operation can be performed at higher speed.

[7] A nonvolatile semiconductor memory device according to the invention has a memory controller and one or more nonvolatile memories. The memory controller issues a write instruction command including address information indicative of an address in which information is to be written to the one or more nonvolatile memories. A first nonvolatile memory in the nonvolatile memories has a plurality of storage regions which are separated by addresses and can be accessed in parallel. The memory controller issues a first write instruction command for instructing writing of information into an address included in a first storage region in the first nonvolatile memory and, before completion of a writing operation in the first storage region, issues a second write instruction command for instructing writing of information to an address included in a second storage region in the first nonvolatile memory.

The nonvolatile memory has, for example, a plurality of memory cells and a writing operation of the nonvolatile memory is performed by selecting a group of memory cells in accordance with an address instructed by the write instruction command and changing a threshold voltage according to information to be written into each of the selected memory cells.

The writing operation of the nonvolatile memory includes, for example, a first operation for changing the threshold voltage of a memory cell, and a second operation for confirming whether the threshold voltage of each of the memory cells has changed to a threshold voltage corresponding to the information to be written. In the case where the threshold voltage of at least one memory cell has not changed to a threshold voltage corresponding to information to be written after the second operation, the first operation is performed.

In the plurality of memory cells, for example, a threshold voltage included in a threshold voltage distribution corresponding to information to be written out of three or more threshold voltage distributions is set.

[8] A nonvolatile memory device according to the invention has: a first terminal used for inputting/outputting data; a second terminal used for inputting an operation instruction command; and a third terminal used for inputting/outputting data and for inputting a clock instructing a timing of inputting the operation instruction command. The nonvolatile memory device further includes: a control unit for controlling an operation according to the operation instruction command input from the second terminal; and one or more nonvolatile memories to/from which data is stored/read on the basis of control of the control unit. The nonvolatile memory has a plurality of memory cells corresponding to addresses, the plurality of memory cells are divided into a plurality of groups and, during a data storing operation of a first group, a data storing operation is started in another group.

For example, the control unit divides data input from the first terminal every predetermined bytes, instructs to store first data into the first group of a first nonvolatile memory, and instructs to store second data into a second group of the first nonvolatile memory.

In the above, the control unit issues, for example, a storage instruction command for instructing a storing operation to the nonvolatile memory. The storage instruction command is constructed by a first command indicating that the command is a storage instruction command, address information for instructing a memory cell to which data is to be stored, data to be stored, and a second command for instructing start of a storing operation.

In the above, the control unit issues, for example, the first command, a first address designating a memory cell in the first group in the first nonvolatile memory, the first data, the second command, after that, the first command, a second address designating a memory cell in the second group in the first nonvolatile memory, the second data, and the second command.

In the above, the control unit issues the first command, a first address designating a memory cell in the first group in the first nonvolatile memory, the first data, after that, the first command, a second address designating a memory cell in the second group in the first nonvolatile memory, the second data, and the second command.

From another viewpoint, for example, the control unit divides data input from the first terminal every predetermined bytes, instructs to store first data into the first group of a first nonvolatile memory, and instructs to store second data into the first group of a second nonvolatile memory.

In the above, the control unit issues the first command, a first address designating a memory cell in the first group in the first nonvolatile memory, the first data, the second command, after that, the first command, a second address designating a memory cell in the first group in the second nonvolatile memory, the second data, and the second command.

In the above, for example, the control unit issues the first command, a first address designating a memory cell in the first group in the first nonvolatile memory, the first data and, after that, the first command, a second address designating a memory cell in the first group in the second nonvolatile memory, the second data, and the second command.

BRIEF DESCRIPTION OF THE DRAWINGS

FIG. 24 is a diagram illustrating commands of the flash memory.

BEST MODE FOR CARRYING OUT THE INVENTION

Memory System

Figure 1:
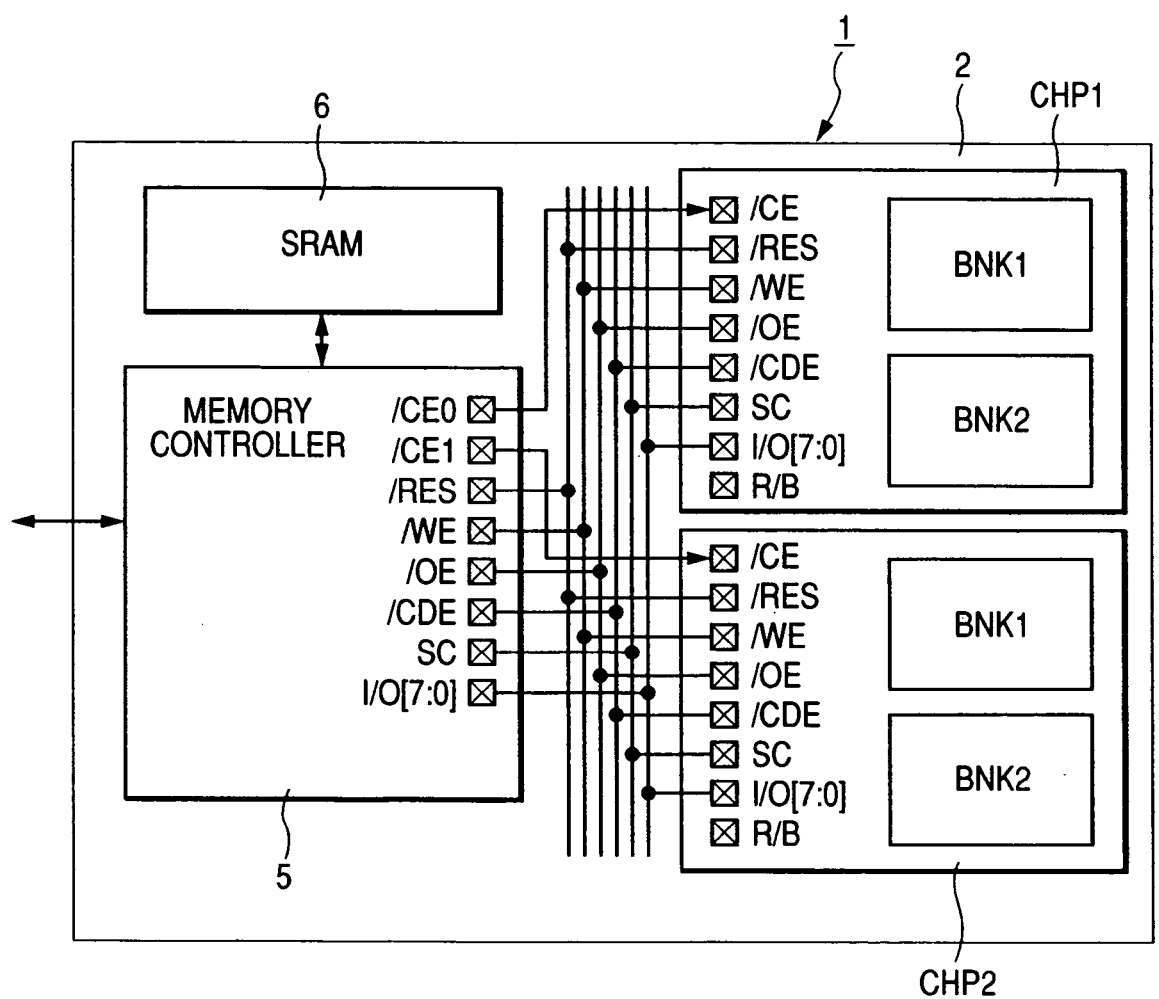
FIG. 1 is a block diagram illustrating a memory card as an example of a memory system according to the invention.

FIG. 1 shows a memory card as an example of a memory system according to the invention. A memory card 1 shown in the diagram has, on a card board 2, plural nonvolatile memory chips, for example, two flash memory chips CHP1 and CHP2 each having plural, for example, two memory banks BNK1 and BNK2 which can operate independently of each other, a memory controller 5 which can control an access to each of the flash memory chips CHP1 and CHP2, and an SRAM 6 connected to the memory controller 5. The SRAM 6 can be used as a data buffer for temporarily storing write data onto the flash memory chips CHP1 and CHP2. The memory controller 5 can selectively instruct the simultaneous writing operation or interleave writing operation on the memory banks BNK1 and BNK2 of the flash memory chips CHP1 and CHP2.

The details of the flash memory chips CHP1 and CHP2 will be described later. The functions for responding to the instruction of the simultaneous writing operation or the interleave writing operation will be described first. Each of the flash memory chips CHP1 and CHP2 has a chip select terminal/CE, a reset terminal/RES, a write enable terminal/WER, an output enable terminal/OE, a command data enable terminal/CDE, a serial clock terminal SC, an input/output terminal I/0[0:7], and a ready/busy terminal R/B. The input/output terminal I/O[0:7] is commonly used for data input/output, address input, and command input. The command input from the input/output terminal I/0[0:7] is synchronized with a change in the command data enable signal/CDE. The data input/output is synchronized with a serial clock SC. Address information is input synchronously with a change in the write enable signal/WE.

Selection of an operation on the flash memory chip CHP1 is instructed by a chip select signal/CE0 from the memory controller 5, and selection of an operation on the flash memory chip CHP2 is instructed by a chip select signal/CE1 from the memory controller 5. Other interface terminals of the flash memory chips CHP1 and CHP2 are commonly connected to corresponding terminals of the memory controller 5.

Memory operations on the flash chips CHP1 and CHP2 selected by the chip enable signals/CE0 and/CE1 are instructed by a command and address information supplied via the input/output terminal I/O[0:7] and, as necessary, write data. The address information includes designation information of the memory bank BNK1 or BNK2 and information of an access address in the designated memory bank. An operation of instructing the memory operation will be called a setup operation. Since the setup operation always needs an interface to the outside, it has to be done serially every memory bank. According to the instruction given by the setup operation, the flash chip CHP1 or CHP2 selected to operate performs a memory operation of writing, erasing, or reading data to/from a flash memory cell. The memory operation can be performed independently for each of the banks in accordance with access control information supplied in the setup operation. Therefore, the memory operation can be performed in memory banks in parallel.

Figure 2:
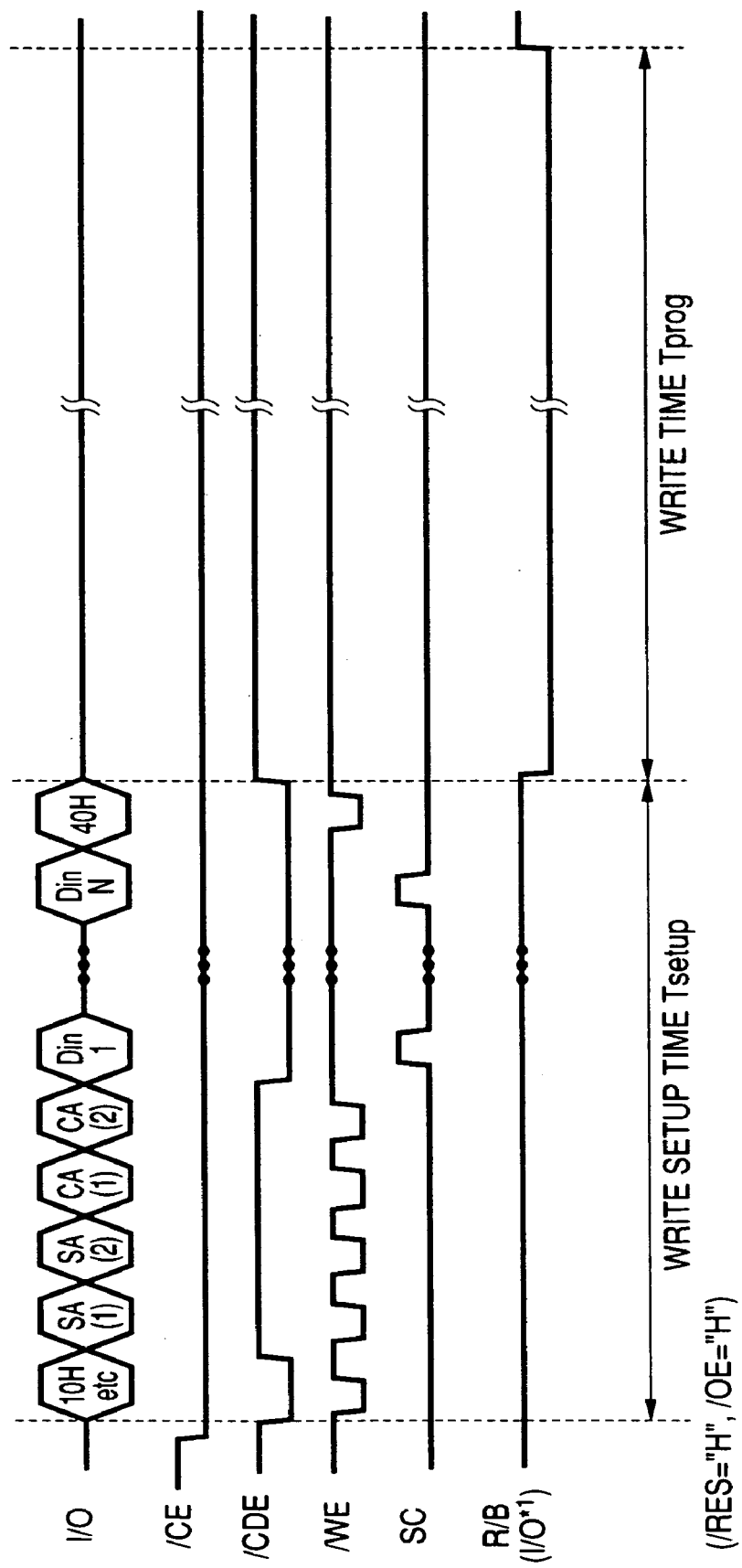
FIG. 2 is a timing chart illustrating a setup operation (write setup operation) and a memory operation (writing operation) for writing.

FIG. 2 is a timing chart showing the setup operation (write setup operation) and a memory operation (writing operation) for writing. "10H" which is input in the write setup operation denotes a write command, "SA(1) and SA(2)" denote sector addresses, "CA(1) and CA(2)" indicate column addresses, "Din1 to Dinn" indicate write data, and "40H" expresses a write start command.

In FIG. 2, time of writing operation (writing operation time Tprog) is much longer than that of write setup (write setup time Tsetup). An amount of the write data Din1 to DinN is generally large, and the write setup time Tsetup is proportional to the amount of write data input synchronously with the serial clock SC.

Figure 3:
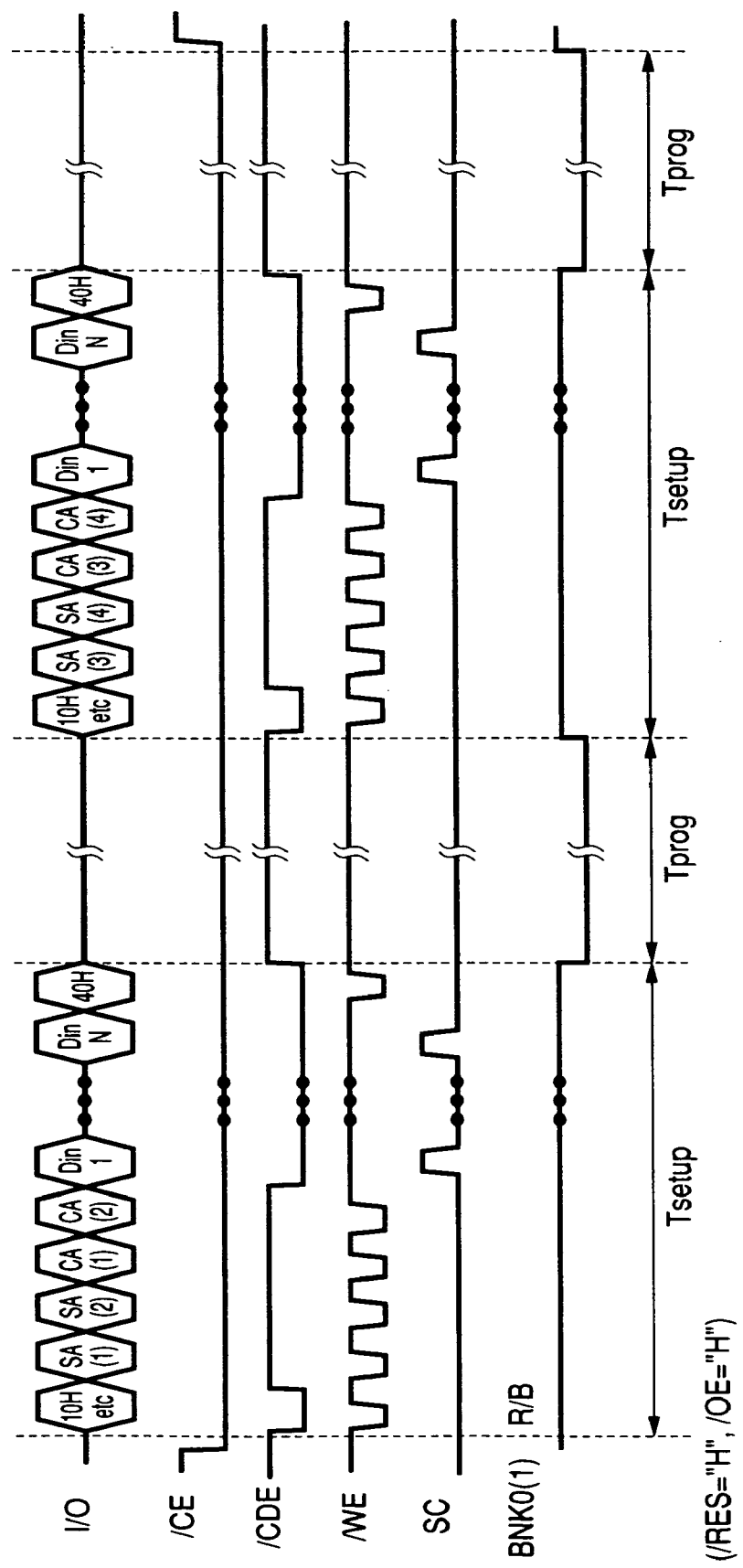
FIG. 3 is a timing chart illustrating a 1-bank operation of operating memory banks one by one in a flash memory chip which is selected to operate.

FIG. 3 is a timing chart of a one-bank operation of making memory banks operate one by one in a flash memory chip selected to operate. The write data is expressed as Din1 to DinN. The writing operation is performed on each of the memory banks BNK1 and BNK2 serially.

Figure 4:
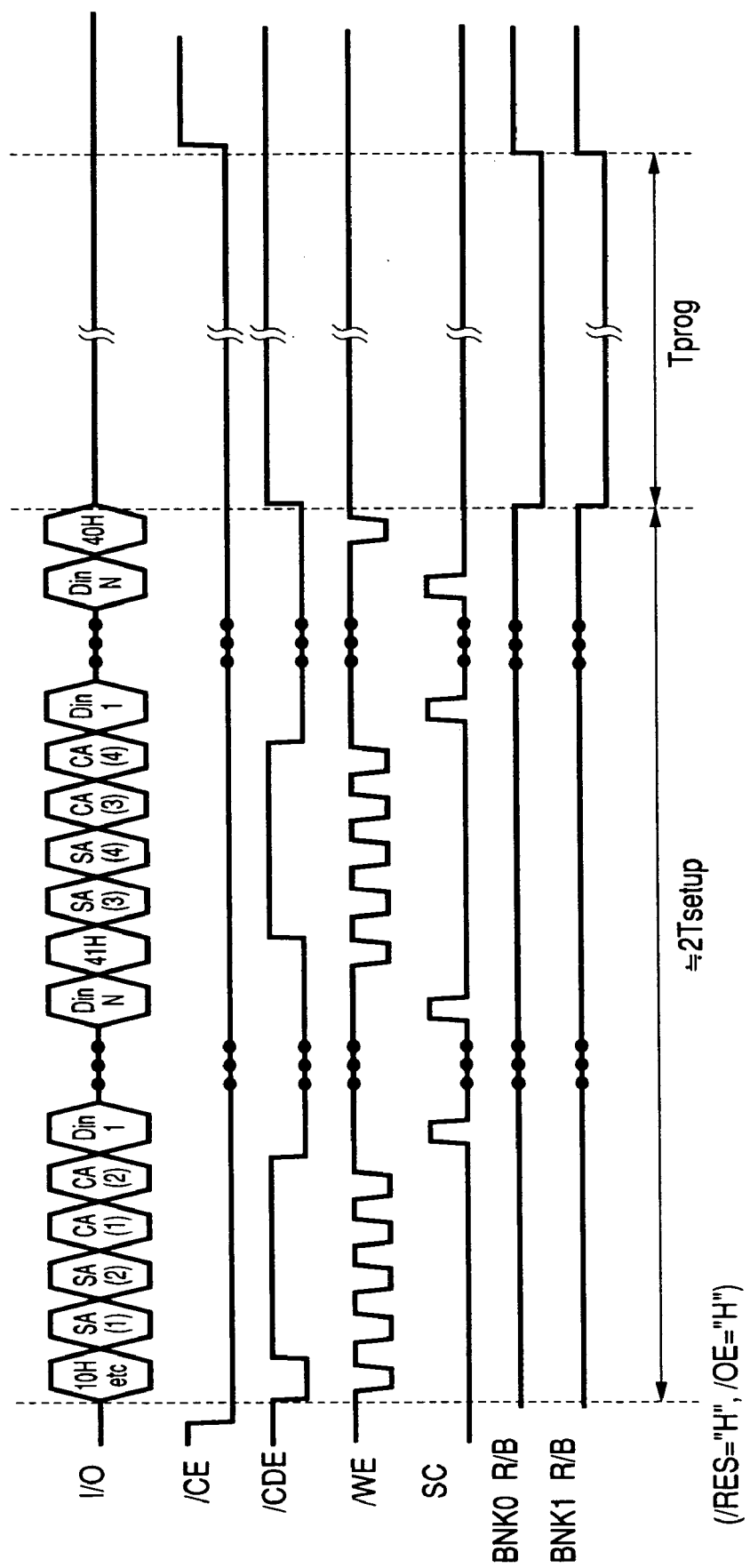
FIG. 4 is a timing chart illustrating simultaneous writing of two banks.

FIG. 4 is a timing chart showing two-bank simultaneous writing. It takes about twice as long as the write setup time Tsetup to input a command and the like but operation time of the two memory banks BNK1 and BNK2 is only the time Tprog since the operations are performed in parallel.

Figure 5:
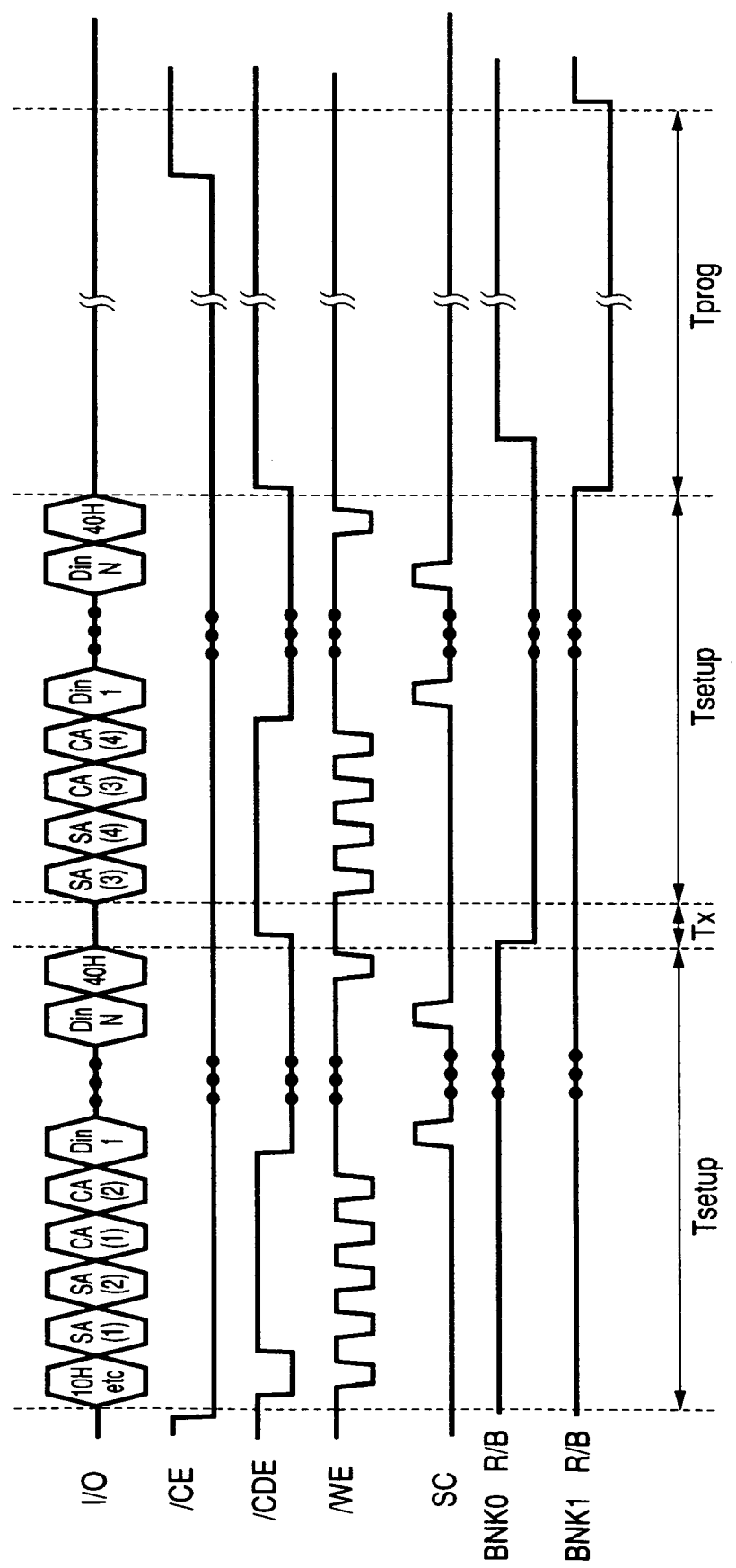
FIG. 5 is a timing chart illustrating an interleave writing operation.

FIG. 5 is a timing chart of the interleave writing operation. In the two-bank simultaneous writing operation, before starting the memory operation in response to an instruction of the writing operation designating one of the memory banks, if there is an instruction of the writing operation designating another memory bank, the writing operation is performed on both of the memory banks in parallel. In contrast, the interleave writing operation is performed in such a manner that even during the memory operation performed in response to an instruction of the writing operation designating one of the memory banks, the memory operation can be performed in response to an instruction of the writing operation designating another memory bank. Time Tx denotes time from issue of the command code "40H" instructing start of the writing operation to issue of the sector address of the following writing operation. The time can be set substantially equal to zero.

Command codes of the write access command in the write setup operation of FIG. 4 are "10H", "41H", and "40H". Command codes of the write access command in the write setup operation in FIG. 5 are "10H", "40H", and "40H". If the time Tx in FIG. 5 is substantially zero, the write setup operation time for two-bank parallel simultaneous writing in FIG. 4 and the write setup operation time for the interleave writing operation of FIG. 5 become substantially equal to each other. In short, the two-bank parallel simultaneous writing operation time of FIG. 4 and the interleave writing operation time of FIG. 5 becomes 2Tsetup+Tprog at the shortest. In contrast, in the one-bank operation of FIG. 3, the shortest time of writing on the two memory banks BNK1 and BNK2 is 2Tsetup+2Tprog.

As described above, the parallel simultaneous writing operation or the interleave writing operation on the plural memory banks is selectively instructed to the flash memory chips CHP1 and CHP2 in accordance with a command code given in the setup operation. Since the parallel writing or interleave writing operation can be performed on the plurality of memory banks 3 and 4, the period of the busy state by the writing operation can be shortened. In short, the process performed in response to the instruction of the writing operation from the memory controller 5 can be performed at higher speed.

It was understood from the above that the writing process can be performed at higher speed by the parallel writing or interleave writing operation in the flash memory chip. The relation of the number of memory banks per flash memory chip and the write speed will now be described for each of the writing operation modes.

Figure 6:
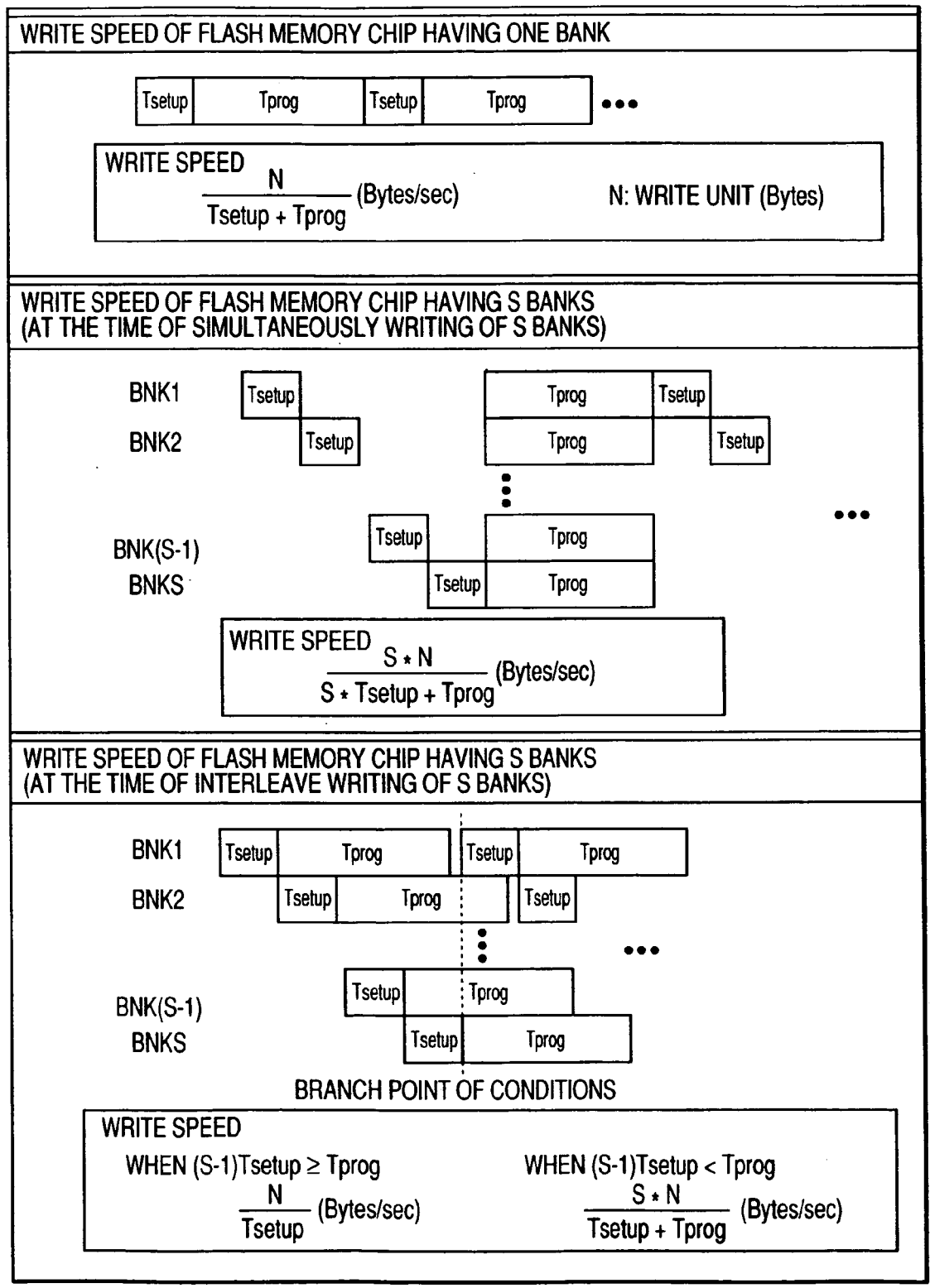
FIG. 6 is a diagram illustrating writing operation timings and write speed for each of writing operation modes.

FIG. 6 shows the writing operation timings and write speed for each of the writing operation modes. In FIG. 6, the write unit of the writing operation is N bytes. The write speed of a flash memory chip having one memory bank is expressed as N/(Tsetup+Tprog) [Bytes/sec].

The write speed in the case of performing simultaneous writing on S memory banks in a flash memory chip having S memory banks is expressed as S·N/(S·Tsetup+Tprog) [Bytes/sec].

The write speed in the case of performing interleave writing on S memory banks in the flash memory chip having S memory banks varies according to the relation between (S−1)·Tsetup and Tprog. In other words, the write speed varies according to whether the writing operation on the memory bank BNK1 has been already finished or not on completion of the setup operation on the memory banks BNK1 to BNKS. When (S−1)·Tsetup≧Tprog, the write speed is expressed as N/Tsetup [Bytes/sec]. When (S−1)·Tsetup<Tprog, the write speed is expressed as S·N/(Tsetup+Tprog) [Bytes/sec].

Figure 7:
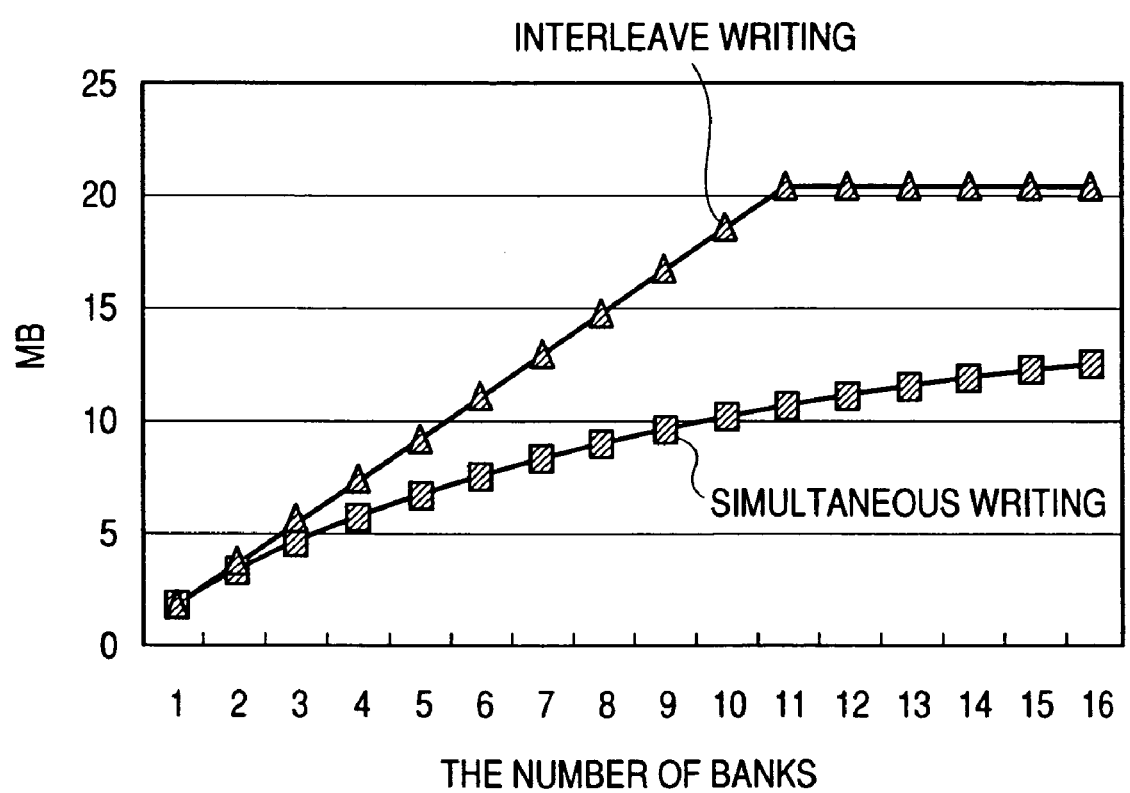
FIG. 7 is a diagram showing the relation between the number of memory banks and write speeds in each of interleave writing and simultaneous writing when N=2 Kbytes, Tsetup=100 μsec, and Tprog=1000 μsec.

FIG. 7 shows the relation between the number of memory banks per flash memory in each of the interleave writing and simultaneous writing and the write speed described with reference to FIG. 6 when N=2 Kbytes, Tsetup=100 μsec, and Tprog=1000 μsec. In the case of interleave writing, when the number of memory banks is increased to a certain value, even if the number is increased further, write operating speed is unchanged. In the case of simultaneous writing, as the number of banks increases, the increase ratio of the writing operation speed gradually decreases. When the number of banks is relatively small, the writing operation speed of the interleave writing and that of the simultaneous writing are almost the same.

The relation between the number of memory banks in a plurality of flash memory chips and the write speed will be described with respect to each of the writing operation modes.

Figure 8:
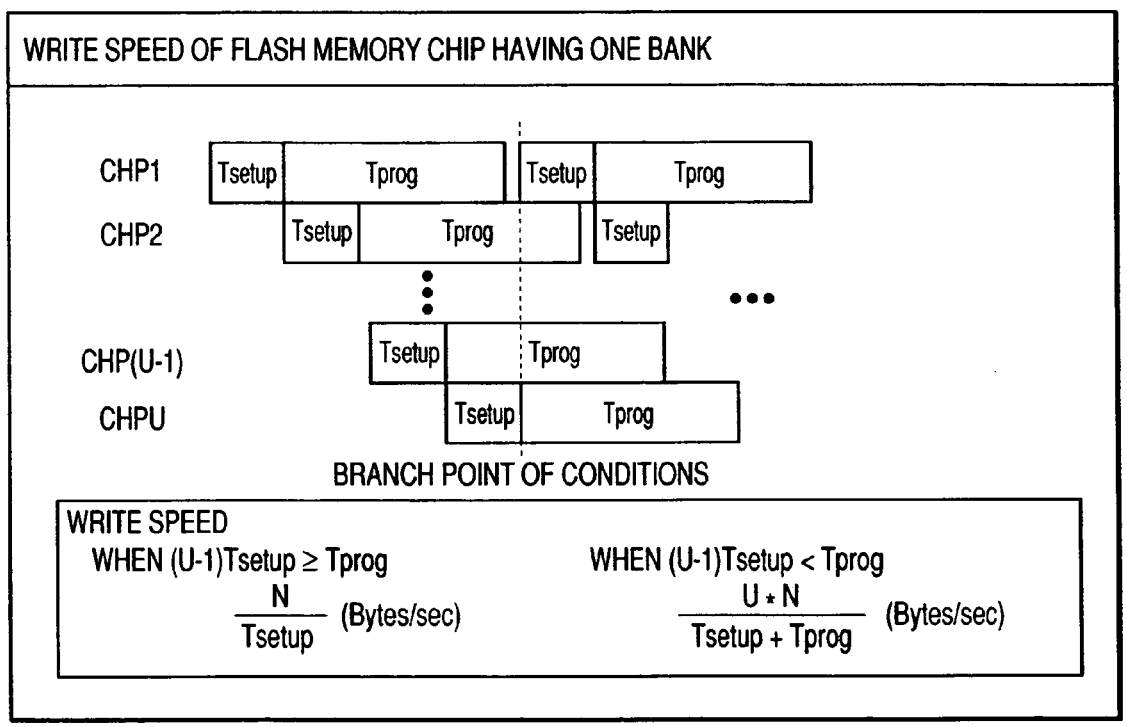
FIG. 8 is a diagram illustrating writing operation timings and write operation speeds when U pieces of 1-bank flash memory chips are used.

FIG. 8 shows writing operation timings and write operation speeds when U pieces of 1-bank flash memory chips are used. The operation mode is equivalent to the interleave writing operation mode on one flash memory chip having U memory banks and corresponds to the S-bank interleave writing operation in FIG. 6. When (U−1)·Tsetup≧Tprog, the write speed is expressed as N/Tsetup [Bytes/sec]. When (U−1)·Tsetup<Tprog, the write speed is expressed as U·N/(Tsetup+Tprog) [Bytes/sec].

Figure 9:
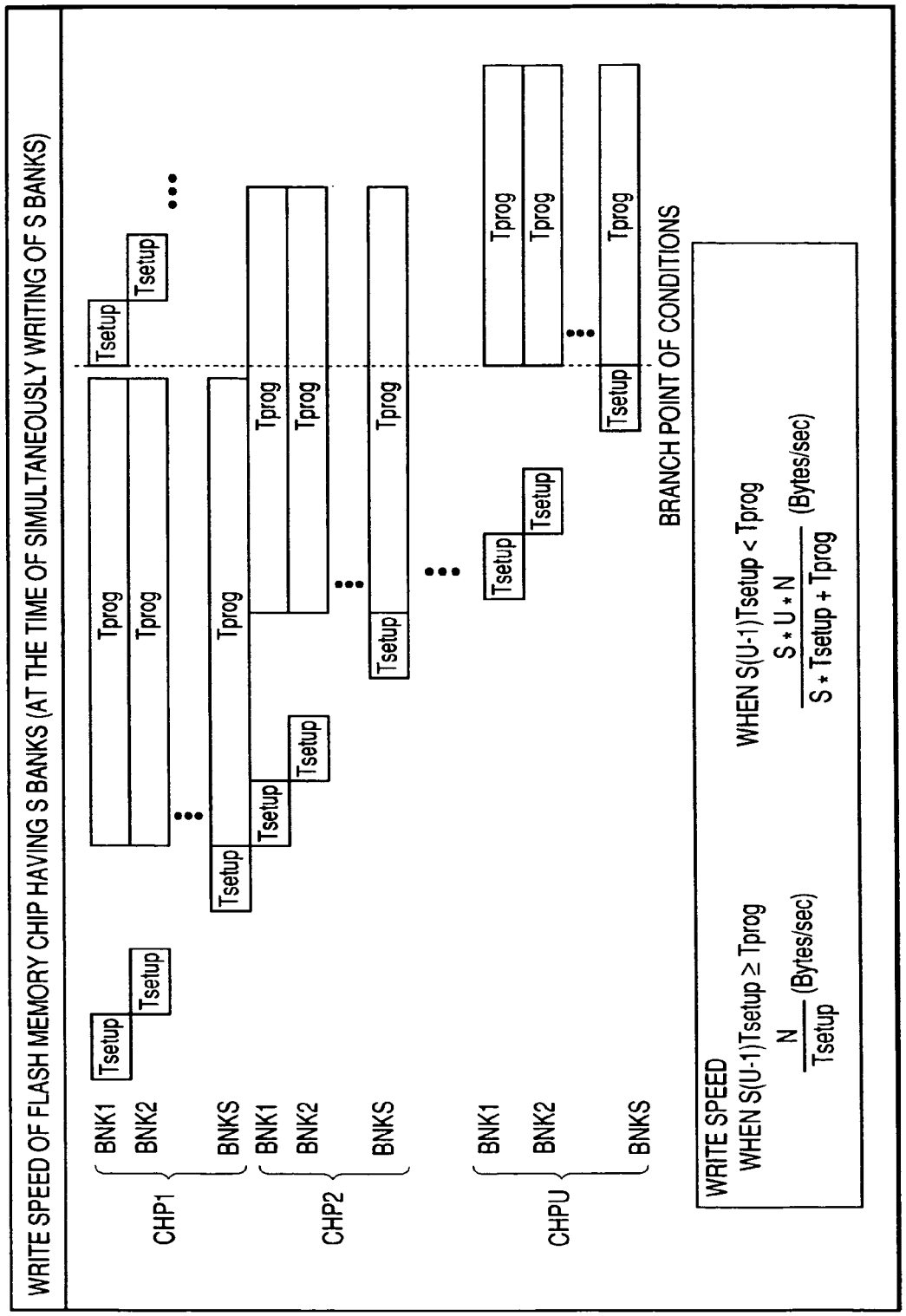
FIG. 9 is a diagram illustrating simultaneous writing operation timings and white operation speeds when U pieces of S-bank flash memory chips are used.

FIG. 9 shows simultaneous writing operation timings and write operation speeds when U pieces of S-bank flash memory chips are used. The operation mode corresponds to a process of U times of the S-bank simultaneous writing operation in FIG. 6. The write speed varies according to the relation between S(U−1)·Tsetup and Tprog. Specifically, the write speed is determined according to whether the interleave writing on all of memory banks BNK1 to BNKS in one chip CHP1 has been already finished or not on completion of the setup operation on the memory banks of all of the chips CHP1 to CHPU. When S(U−1)·Tsetup≧Tprog, the write speed is expressed as N/Tsetup [Bytes/sec]. When S(U−1)·Tsetup<Tprog, the write speed is expressed as S·U·N/(S·Tsetup+Tprog) [Bytes/sec].

Figure 10:
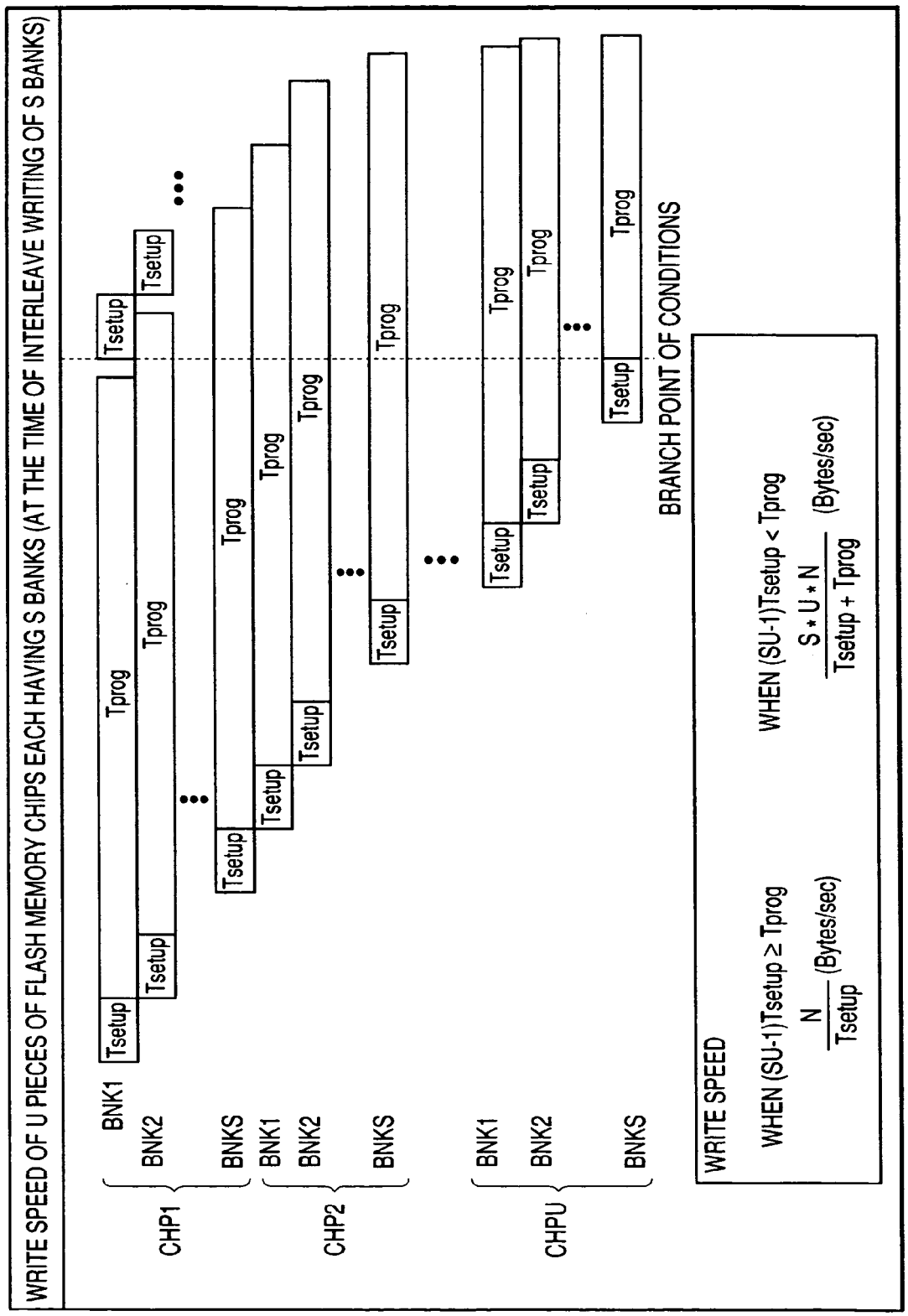
FIG. 10 is a diagram illustrating interleave writing operation timings and writing operation speeds when U pieces of S-bank flash memory chips are used.

FIG. 10 shows the interleave writing operation timings and writing operation speeds when U pieces of S-bank flash memory chips are used. The operation mode is equivalent to the interleave writing operation mode on one flash memory chip having S·U memory banks and corresponds to the process of U times of the S-bank interleave writing operation in FIG. 6. The write speed varies according to the relation between (S·U−1)·Tsetup and Tprog. Specifically, the write speed is determined according to whether the interleave writing on one memory bank BNK1 in one chip CHP1 has been already finished or not on completion of the setup operation on the memory banks of all of the chips CHP1 to CHPU. When (SU−1) Tsetup≧Tprog, the write speed is expressed as N/Tsetup [Bytes/sec]. When (SU−1)·Tsetup<Tprog, the write speed is expressed as S·U·N/(Tsetup+Tprog) [Bytes/sec].

Figure 11:
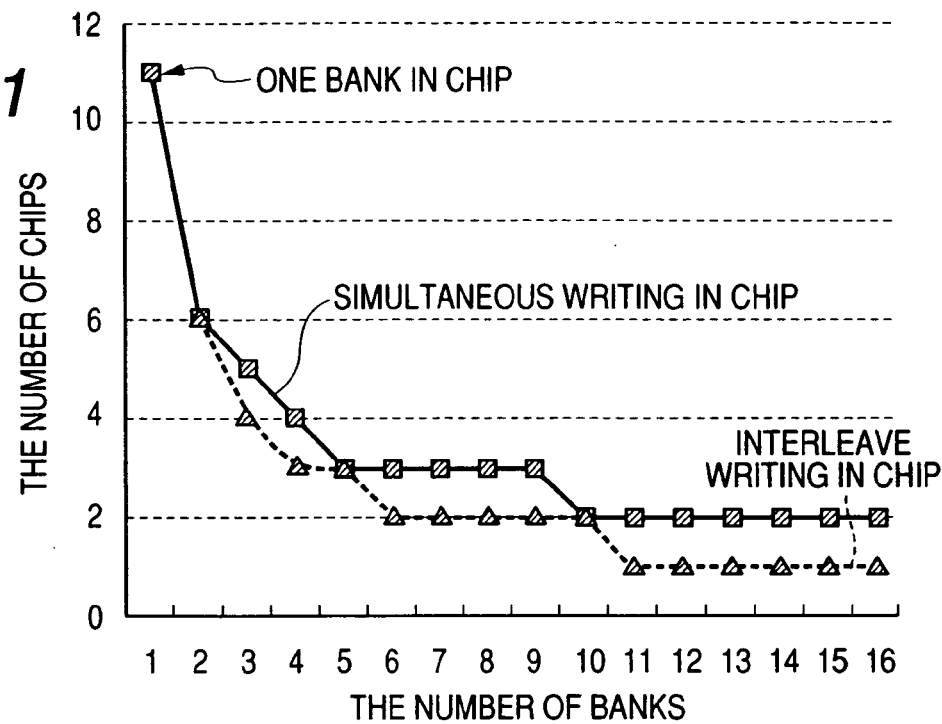
FIG. 11 is a diagram illustrating the relation between the number of chips and the number of memory banks at which the write speed becomes the highest in each of the writing operation modes in FIGS. 8 to 10.

The case where the write speed becomes N/Tsetup [Bytes/sec] in the writing operation modes of FIGS. 8 to 10, that is, a state where the write speed does not increase even if the number of chips is increased denotes a state where setup data and write data can be always sent from the memory controller 5 to the flash memory chips. The number of chips at the boundary point at which the write speed does not increase even if the number of chips is increased gives the minimum value of the area of the system at which the write speed in each of the writing operation modes becomes the maximum, in short, the minimum value of the number of flash memory chips. From this viewpoint, FIG. 11 shows the relation between the number of chips and the number of memory banks at which the write speed becomes the maximum in each of the writing operation modes of FIGS. 8 to 10. In the diagram, the conditions are: Tsetup=100 μsec and Tprog=1000 μsec. It is clarified from FIG. 11 that by performing the simultaneous writing or interleave writing in the memory chip by using the flash memory chip having the multibank configuration having a plurality of memory banks which can operate independent of each other, the number of flash memory chips necessary to construct the memory system having high writing speed can be reduced.

As described above, in the selectable simultaneous writing operation, the writing operation which is much longer than the write setup time can be performed perfectly in parallel on the multiple banks of the multiple chips. In the selectable interleave writing operation, the writing operation following the write setup on one memory bank in the multiple banks in the multiple chips is sequentially performed and partially overlaps the writing operation on another memory bank, thereby performing the operations in parallel. Thus, the number of nonvolatile memory chips constructing the memory system performing the high-speed writing operation can be made relatively small.

The memory controller discriminates between the instruction of the simultaneous writing operation and the instruction of the interleave writing operation in accordance with the kind of the command code for instructing the writing operation, accompanying the write address information and the write data information. Alternately, the instruction can be given by register setting. However, as compared with the register setting, the method of the invention can omit a special control mode. It is sufficient to supply a write command so as to accompany the write address information and the write data information.

Application to Multimedia Card

Figure 12:
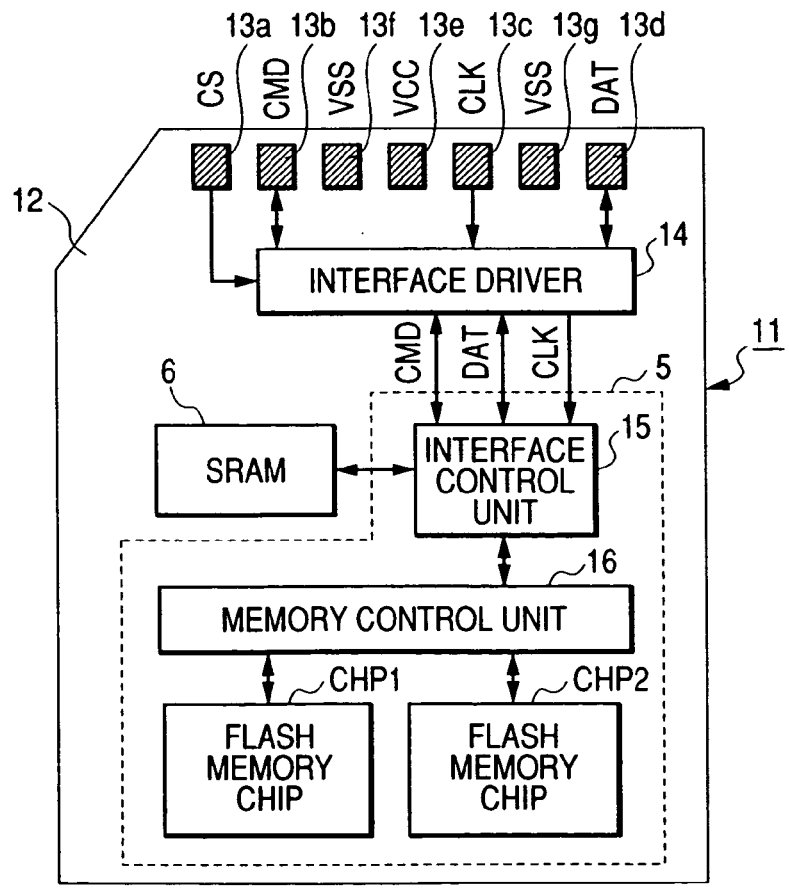
FIG. 12 is a block diagram of a multimedia card to which the invention is applied.

FIG. 12 illustrates a multimedia card to which the invention is applied. A multimedia card 11 has card dimensions of 24 mm×32 mm×1.4 mm in specifications according to a standardization group. A card board 12 has, as connection terminals, a connection terminal 13a for inputting a card select signal CS, a connection terminal 13b for inputting a command CMD, a connection terminal 13c for inputting a clock signal CLK, a connection terminal 13d for inputting/outputting data DAT, a connection terminal 13e to which the power source voltage Vcc is supplied, and two connection terminals 13f and 13g to which the ground voltage Vss is supplied.

The card board 12 is provided with an interface driver 14, the memory controller 5, the SRAM 6, and the flash memory chips CHP1 and CHP2. The memory controller 5 has an interface control unit 15 and a memory control unit 16. The interface control unit 15 has a control logic circuit for host interface control, file control, and data transfer control. The interface control unit 15 receives a command supplied from a host system via the interface driver 14, decodes the command, and gives an operation instruction to the memory control unit 16. The memory control unit 16 receives the instruction and controls an access to file data in the flash memory chips CHP1 and CHP2. For example, the interface control unit 15 temporarily stores write data supplied from the outside into the SRAM and instructs the memory control unit 16 to perform simultaneous writing on the multiple banks in the multiple chips or interleave writing on the multiple banks in the multiple chips. In accordance with the instruction, the memory control unit 16 supplies the command code and write data to the flash memory chips CHP1 and CHP2 and controls the simultaneous writing on the multiple banks in the multiple chips or the interleave writing on the multiple banks of the multiple chips.

The write speeds in various writing operation modes in the multimedia card 11 will now be described. The characteristics of the flash memory chips CHP1 and CHP2 are set as Tsetup=100 μsec, Tprog=2000 μsec, and one sector as a write unit corresponding to N has 2 Kbytes. Since data is serially input in cycles of 50 nsec from the host system to the data terminal DAT, it takes about 0.82 msec (≈2048×8×50) to input the write data of 2 Kbytes to the data terminal DAT.

Figure 13:
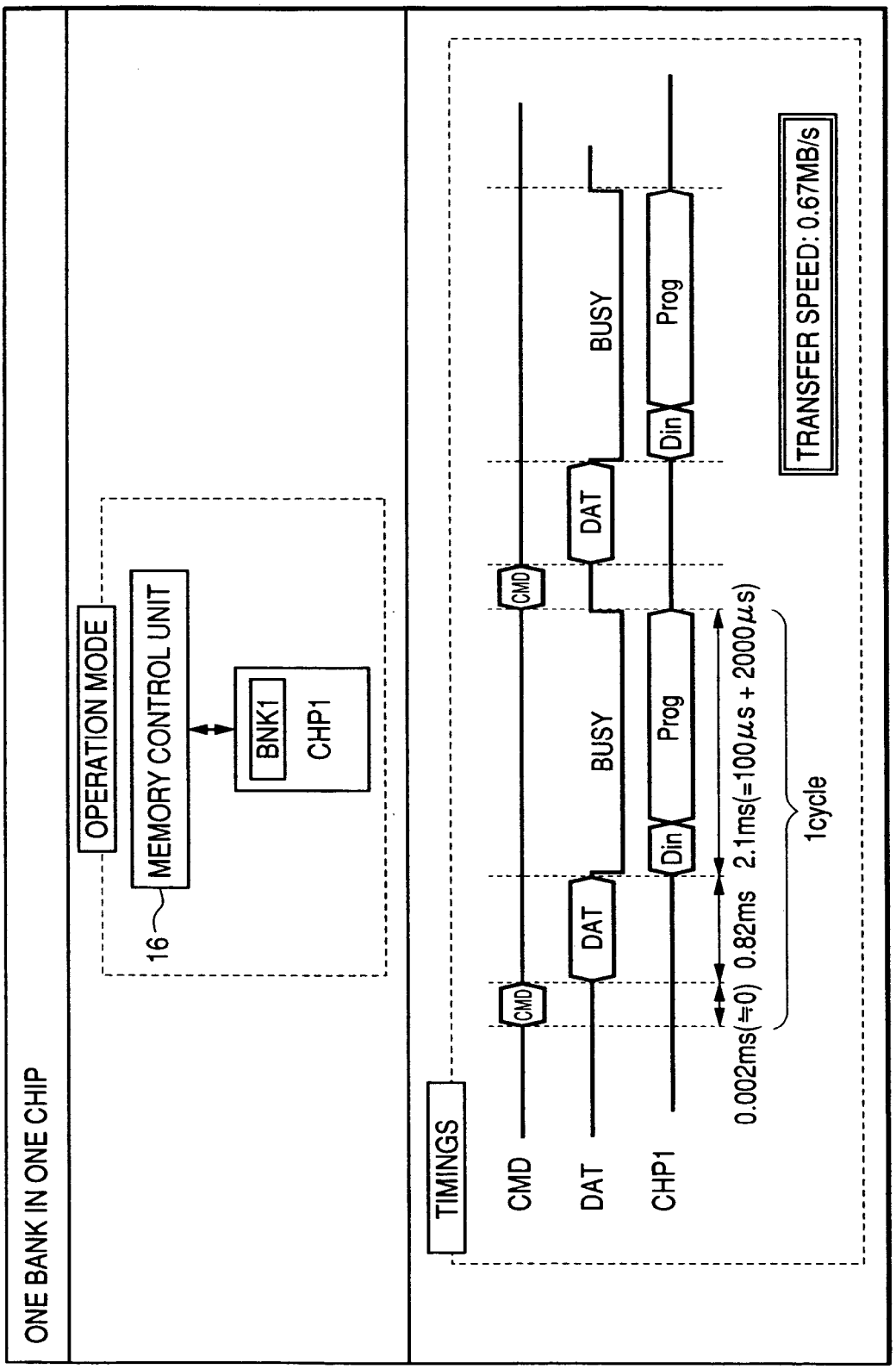
FIG. 13 is a diagram illustrating the writing operation mode and the operation timings when a form of one bank in one chip is used.

FIG. 13 illustrates writing operation timings of the operation mode using only one memory bank of one flash memory chip (mode of using one bank in one chip). The data transfer speed from the host system to the memory card in this case is 0.67 Mbytes/sec.

Figure 14:
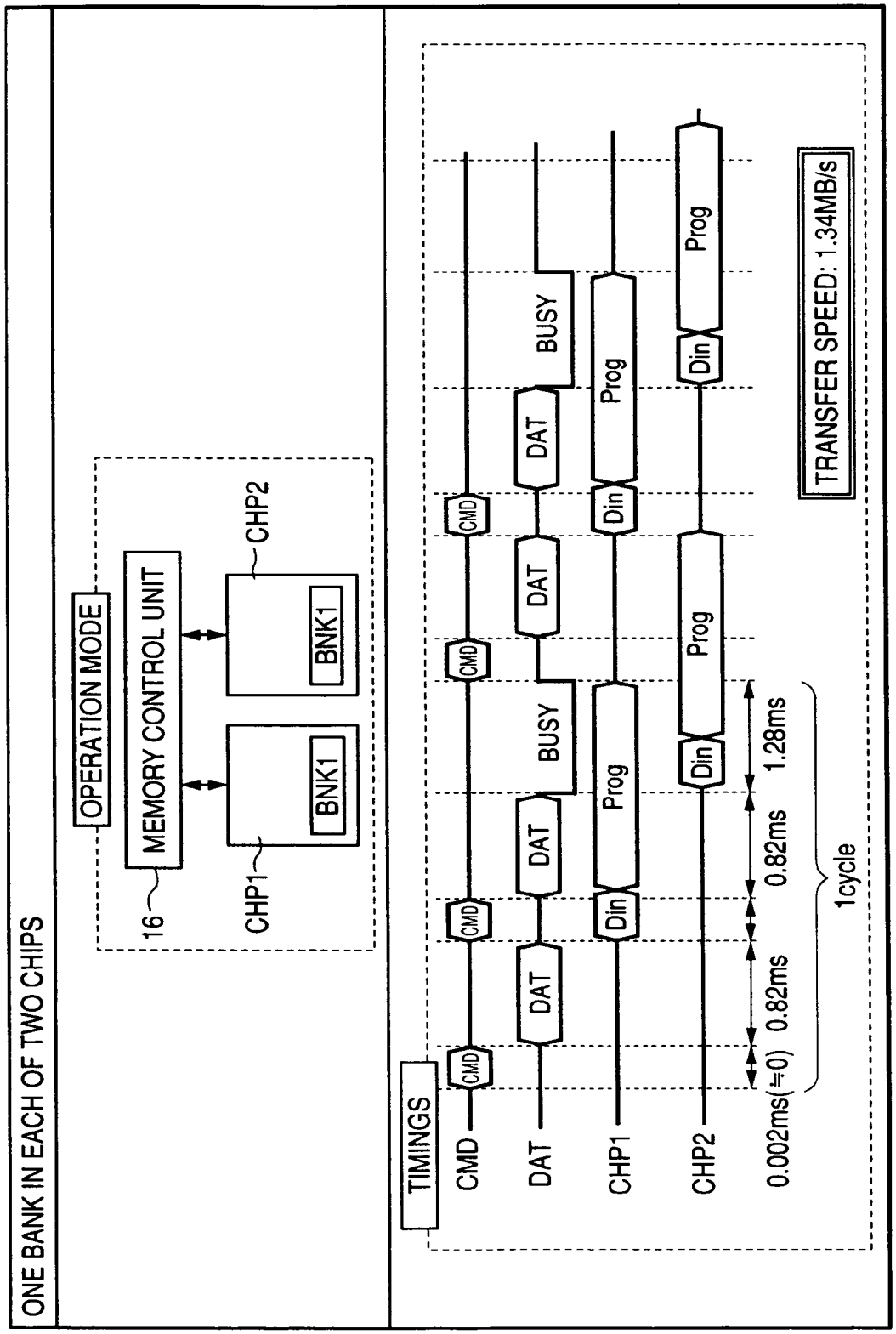
FIG. 14 is a diagram illustrating the writing operation mode and the operation timings when a form of one bank in two chips is used.

FIG. 14 illustrates writing operation timings of the operation mode using one memory bank of each of two flash memory chips (mode of using one bank in each of two chips). The data transfer speed from the host system to the memory card in this case is 1.34 Mbytes/sec.

Figure 15:
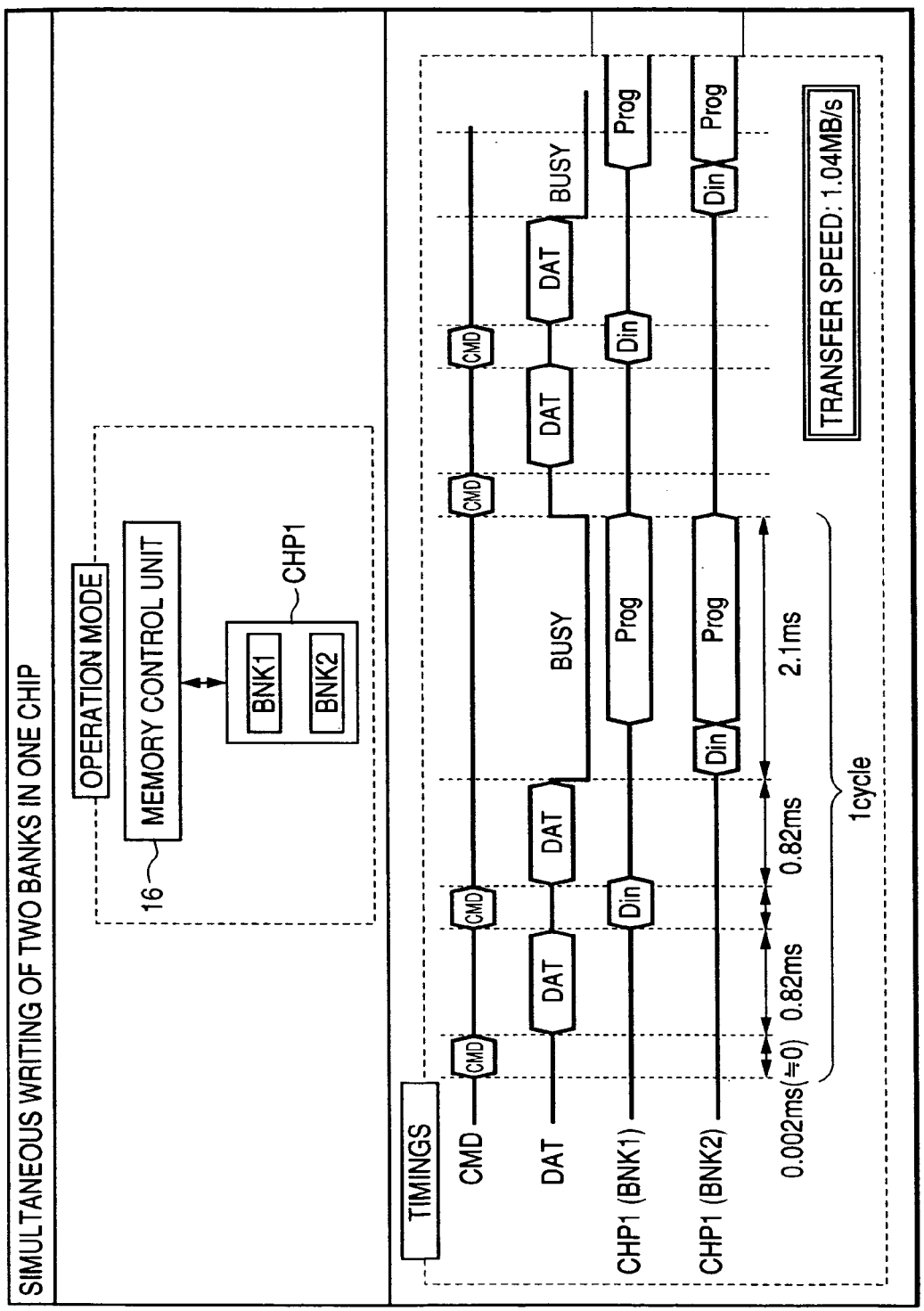
FIG. 15 is a diagram illustrating the writing operation mode and the operation timings when a form of simultaneously writing two banks in one chip is used.

FIG. 15 illustrates writing operation timings of the operation mode of performing simultaneous writing on two memory banks in one flash memory chip (mode of performing simultaneous writing on two banks in one chip) The data transfer speed from the host system to the memory card in this case is 1.04 Mbytes/sec.

Figure 16:
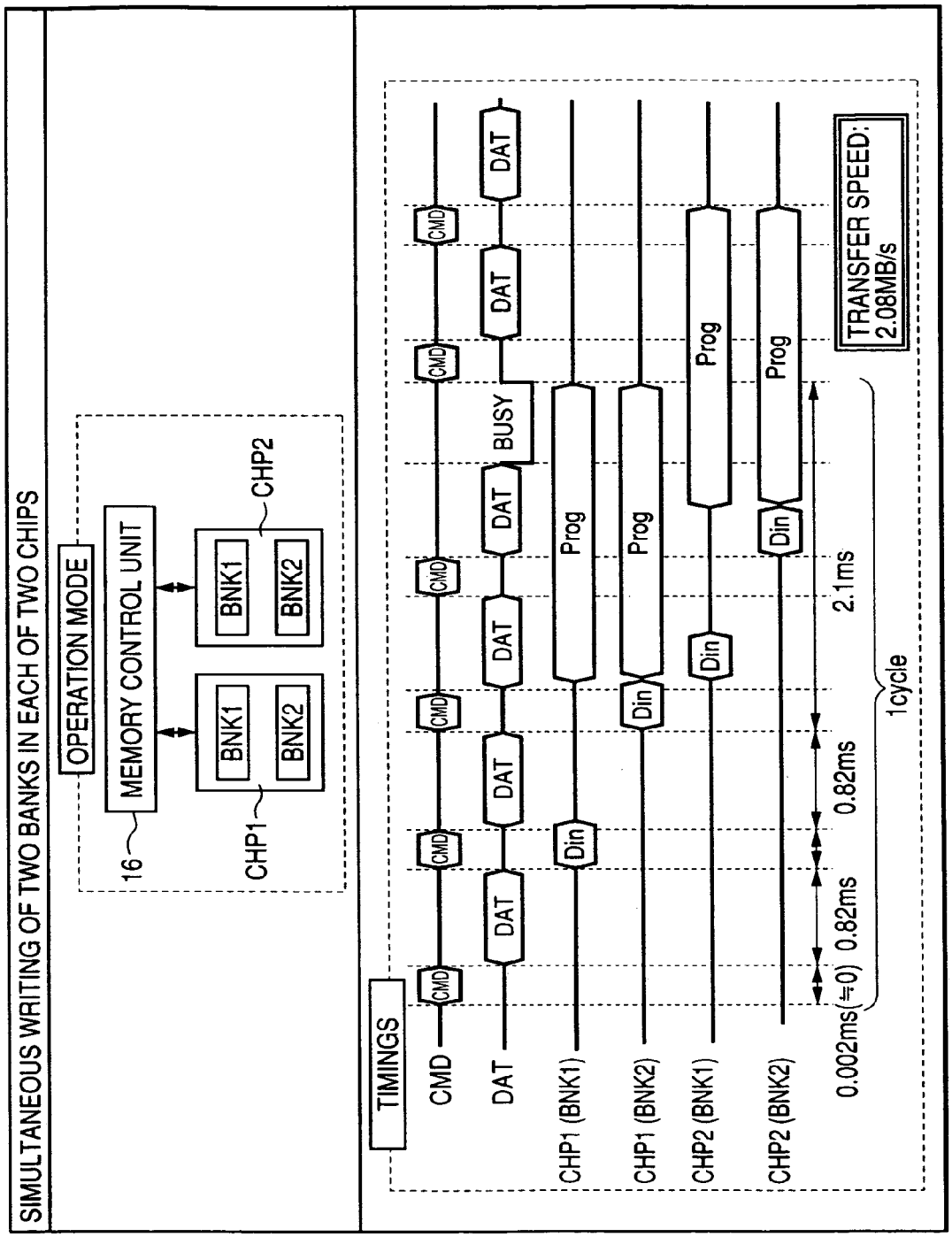
FIG. 16 is a diagram illustrating the writing operation mode and the operation timings when a form of simultaneously writing two banks in each of two chips is used.

FIG. 16 illustrates writing operation timings of the operation mode of performing simultaneous writing on two memory banks in each of two flash memory chips (mode of performing simultaneous writing on two banks in each of two chips). The data transfer speed from the host system to the memory card in this case is 2.08 Mbytes/sec.

Figure 17:
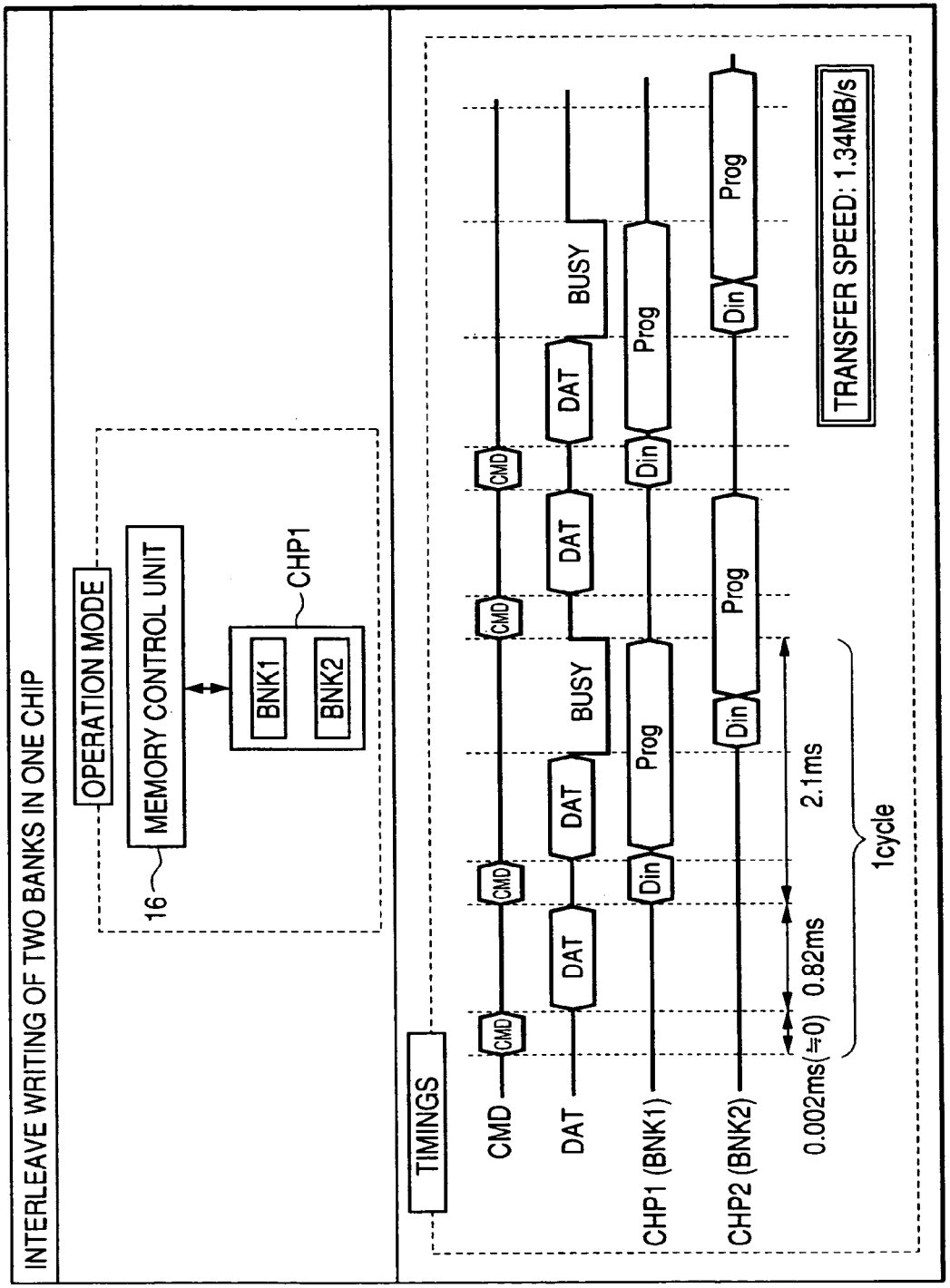
FIG. 17 is a diagram illustrating the writing operation mode and the operation timings when a form of interleave writing two banks in one chip is used.

FIG. 17 illustrates writing operation timings of the operation mode of performing interleave writing on two memory banks in one memory chip (mode of performing interleave writing on two banks in one chip). The data transfer speed from the host system to the memory card in this case is 1.24 Mbytes/sec.

Figure 18:
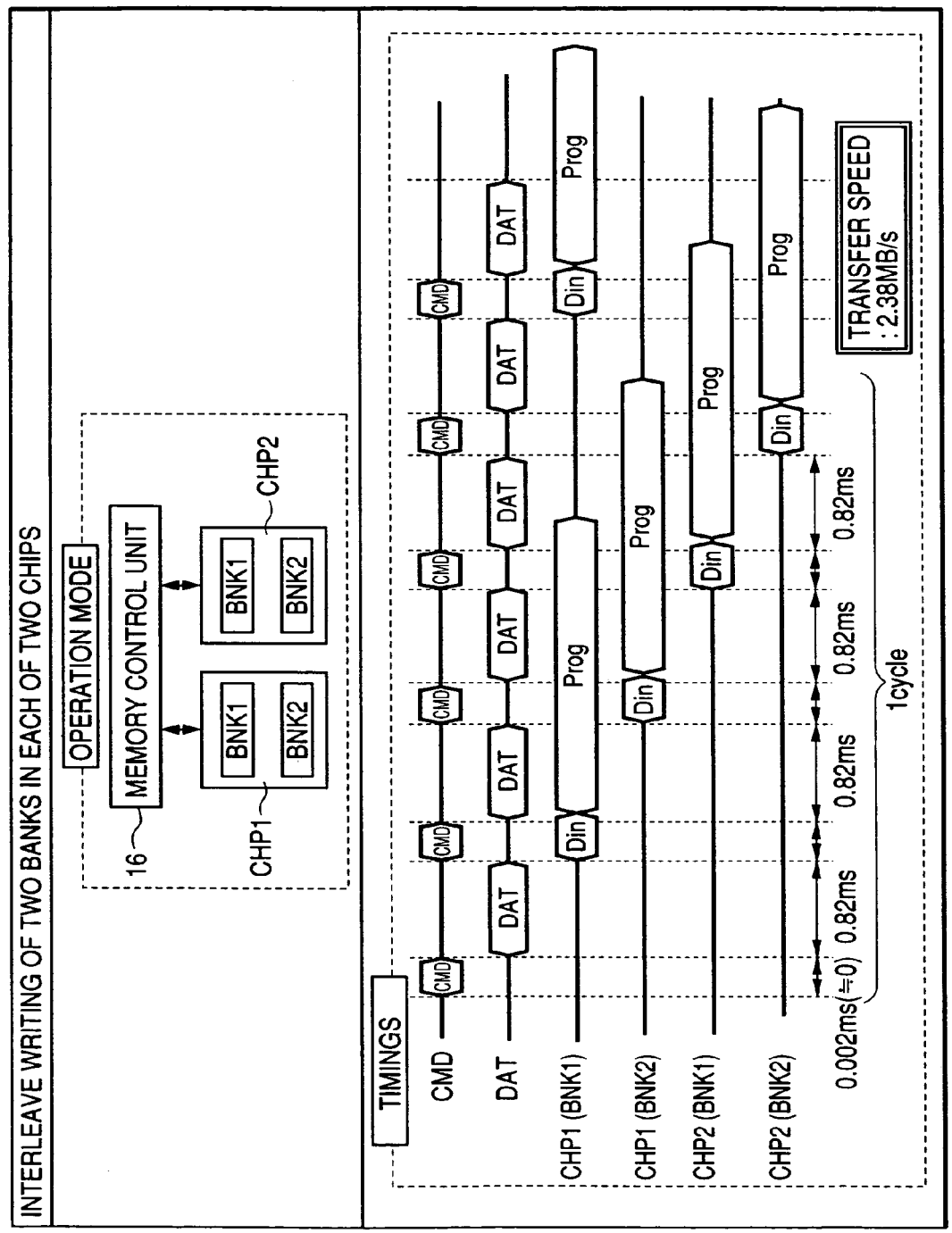
FIG. 18 is a diagram illustrating the writing operation mode and the operation timings when a form of interleave writing two banks in each of two chips is used.

FIG. 18 illustrates writing operation timings of the operation mode of performing interleave writing on two memory banks in each of two flash memory chips (mode of performing interleave writing on two banks in each of two banks). The data transfer speed from the host system to the memory card in this case is 2.38 Mbytes/sec.

As understood from the results of operation speeds of the operation modes in FIGS. 13 to 18, in the case of employing two operation modes of the operation mode of performing simultaneous writing on two banks in each of two banks as shown in FIG. 16 and the operation mode of performing interleave writing on two banks in each of two chips, the data transfer speed from the host system side can be made relatively high. The operation mode of using the simultaneous writing on two banks in each of two chips shown in FIG. 16 is one mode of the simultaneous writing on S banks in each of plural chips in FIG. 9. The operation mode of performing interleave writing on two banks in each of two chips shown in FIG. 18 is one mode of the S-bank interleave writing of FIG. 10. It becomes therefore more apparent that, by employing the simultaneous writing operation or interleave writing operation on multiple banks in multiple chips, a memory system of a high-speed writing process can be constructed.

Either the simultaneous writing or interleave writing is employed arbitrarily on the host system side. In the case of FIG. 18, although the processing speed in the case of FIG. 18 is the highest, the host system has to continuously send the write command and write data without intermission. In the case of FIG. 16, a slightly busy state occurs on the memory card side and the processing speed slightly decreases. However, the host system can have freedom of performing another process during the period of the busy state.

General Configuration of Flash Memory

Figure 19:
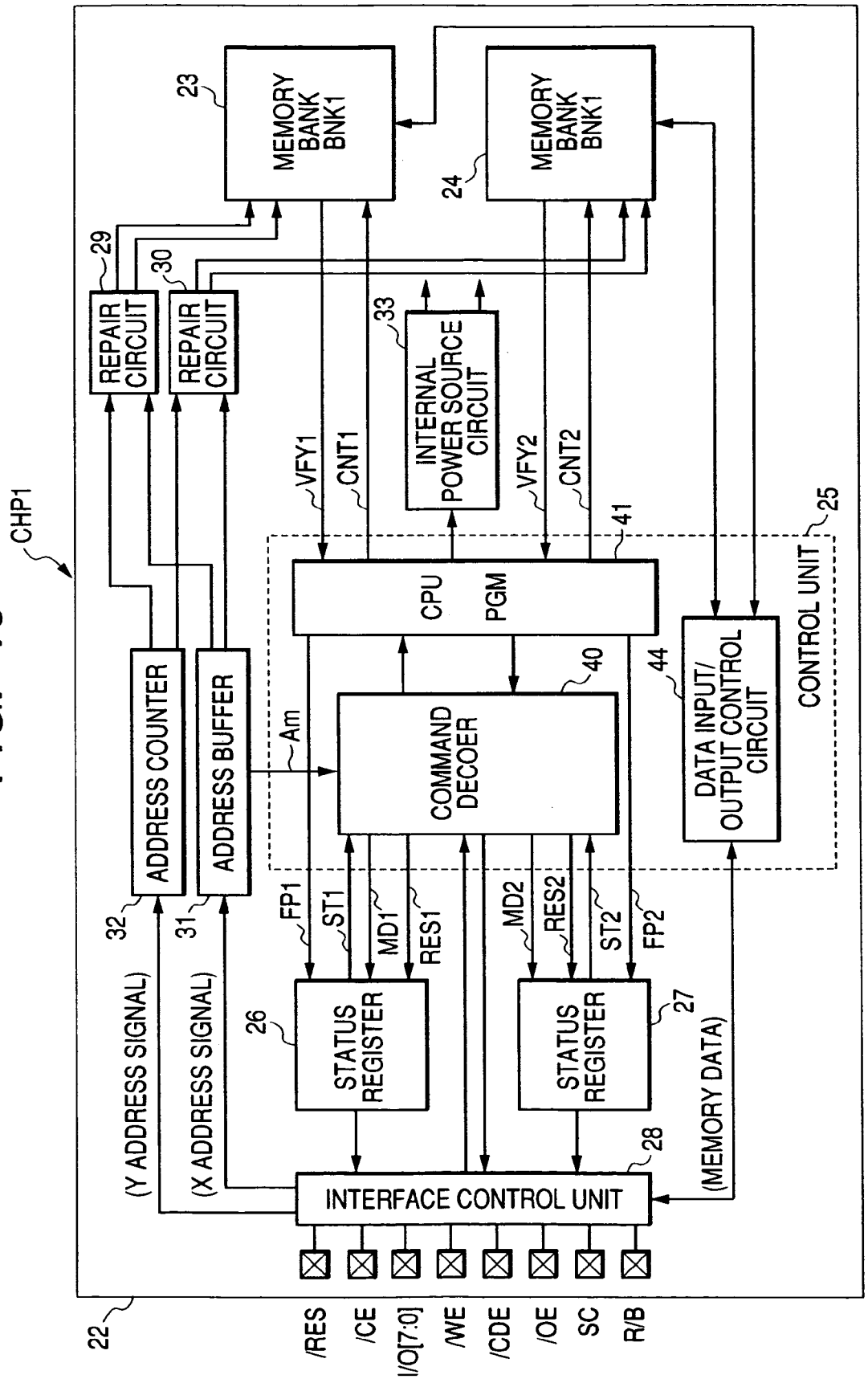
FIG. 19 is a block diagram generally showing an example of a flash memory chip.

FIG. 19 shows an example of the flash memory chip CHP1 as a whole.

The flash memory chip CHP1 has, on one semiconductor board (semiconductor chip) 22 made of single crystal silicon or the like, plural memory banks, for example, two memory banks BNK1 and BNK2 which can operate independent of each other, a control unit 25 for controlling the memory operation on the two memory banks BNK1 and BNK2, status registers 26 and 27 provided for the memory banks BNK1 and BNK2, an interface control unit 28 as an interface to the outside, repair circuits 29 and 30 assigned to the memory banks BNK1 and BNK2, respectively, an address buffer 31, an address counter 32, and an internal power source circuit 33. The control unit 25 includes a command decoder 40, a processor (which will be also simply described as CPU) 41 having a CPU (Central Processing Unit) and an operation program memory (PGM), and a data input/output control unit 42.

The input/output terminal I/O[7:0] of the flash memory chip CHP1 is used commonly for address input, data input/output, and command input. An X address signal input from the input/output terminal I/O[7:0] is supplied to the X address buffer 31 via the interface control unit 28, and an input Y address signal is preset in the Y address counter 32 via the interface control unit 28. A command input from the input/output terminal I/O[7:0] is supplied to the command decoder 40 via the interface control unit 28. Write data to be supplied from the input/output terminal I/O[7:0] to the memory banks BNK1 and BNK2 is supplied to the data input/output control circuit 42 via the interface control unit 28. Read data from the memory banks BNK1 and BNK2 is supplied from the data input/output control circuit 42 to the input/output terminal I/O[7:0] via the interface control unit 28. A signal input/output to/from the input/output terminal I/O[7:0] is also called a signal I/O[7:0] for convenience.

The interface control unit 28 inputs, as access control signals, the chip enable signal/CE, output enable signal/OE, write enable signal/WE, serial clock signal SC, reset signal/RES, and command enable signal/CDE. The sign "/" attached at the head of the signal name indicates that the signal is enable low. The interface control unit 28 controls a signal interface function to the outside or the like in accordance with the state of each of the signals.

Each of the memory banks BNK1 and BNK2 has a number of nonvolatile memory cells capable of rewriting stored information. A part of the nonvolatile memory cells is a repair (redundant) memory cell with which a defective memory cell is replaced. Each of the repair circuits 29 and 30 has a program circuit (not shown) capable of programming an address of a defective memory cell to be replaced with the repair memory cell and an address converter (not shown) for determining whether the programmed address to be repaired is designated as an access address or not. An X address signal for selecting a nonvolatile memory cell from the memory banks BNK1 and BNK2 is output from the address buffer 31, and a Y address signal for selecting a nonvolatile memory cell from the memory banks BNK1 and BNK2 is output from the address counter 32. The X address signal and the Y address signal are supplied to the repair circuits 29 and 30. If the signal indicates an address of a nonvolatile memory cell to be repaired, the address is replaced. If the signal does not indicate an address of a nonvolatile memory cell to be repaired, the signal is passed through and supplied to the memory banks BNK1 and BNK2.

Figure 20:
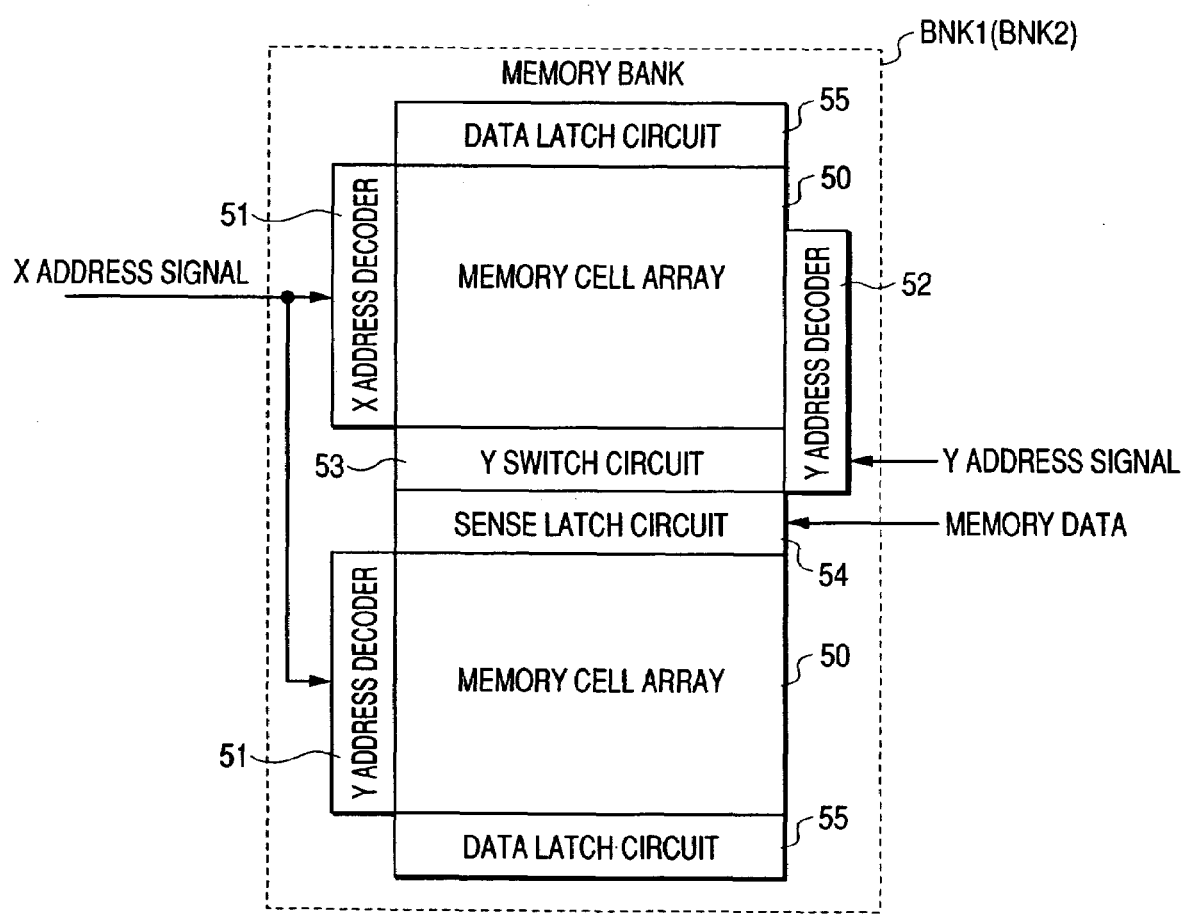
FIG. 20 is a block diagram showing an example of a memory bank.
Figure 21:
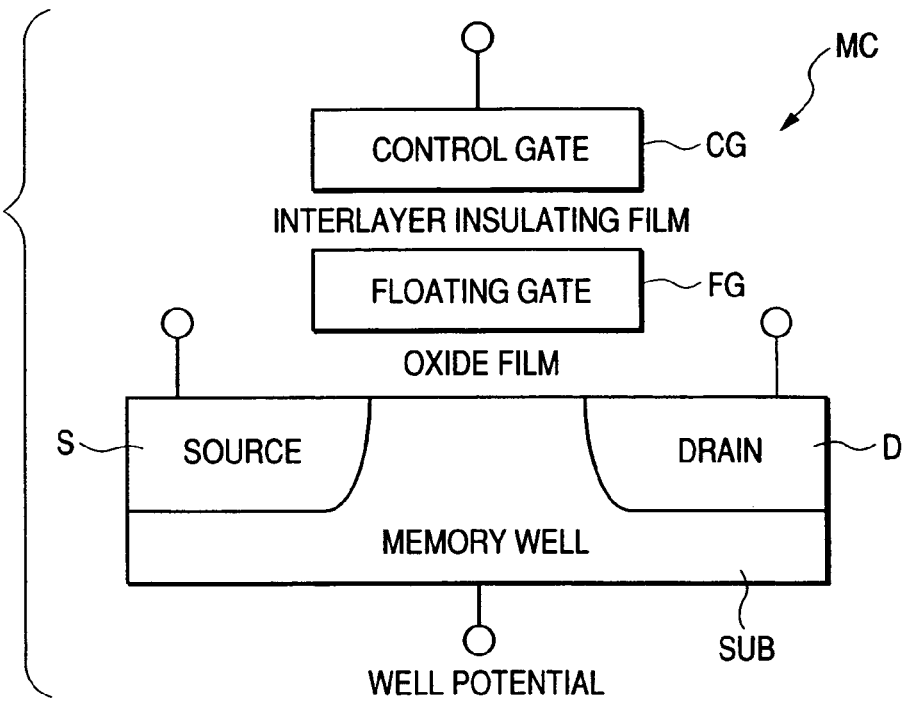
FIG. 21 is a diagram illustrating a sectional structure of a nonvolatile memory cell.
Figure 22:
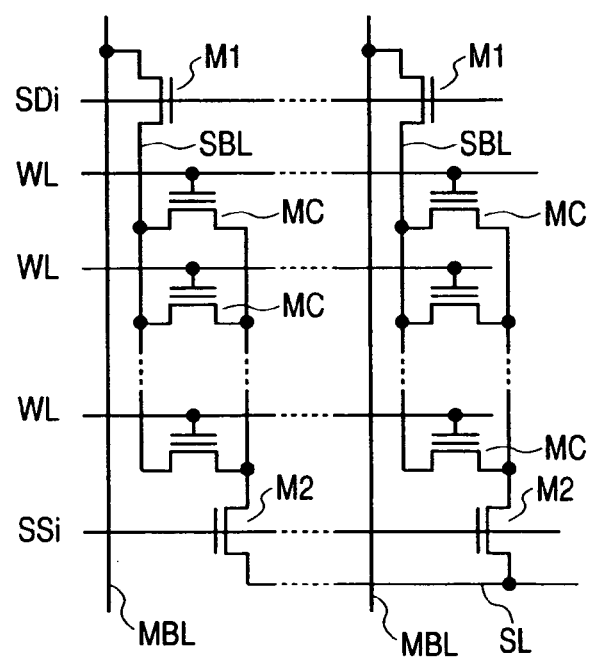
FIG. 22 is a circuit diagram illustrating a part of an AND-type memory cell array.

Each of the memory banks BNK1 and BNK2 includes, although not limited, as shown in FIG. 20, a memory cell array 50, an X address decoder 51, a Y address decoder 52, a Y switch circuit 53, a sense latch circuit 54, and a data latch circuit 55. The memory cell array 50 has a number of electrically erasable and programmable nonvolatile memory cells. For example, as shown in FIG. 21, a nonvolatile memory cell MC has a source S and a drain D formed in a semiconductor substrate or a memory well SUB, a floating gate FG formed over a channel region via an oxide film, and a control gate CG overlapping the floating gate FG via an interlayer insulating film. In the memory cell array 50, in the case of an AND-type array illustrated in FIG. 22, a sub bit line SBL illustrated representatively is connected to a main bit line MBL via a selection MOS transistor M1, and the drain of the nonvolatile memory cell MC is coupled to the sub bit line SBL. The sources of nonvolatile memory cells MC sharing the sub bit line SBL are commonly connected to a source line SL via a second selection MOS transistor M2. Switching of the first selection MOS transistor M1 is controlled by a bit line control line SDi on a row direction unit basis and switching of the second selection MOS transistor M2 is controlled by a source line control line SSi on the row direction unit basis.

The X address decoder 51 in FIG. 20 decodes an X address signal, and selects the word line WL, bit line control line SDi, and source line control line SSi in accordance with a designated memory operation. The Y address decoder 52 decodes the Y address signal output from the address counter 32, and generates a switching control signal of the Y switch circuit 53 for bit line selection. The data latch circuit 55 has the function of a data buffer for temporarily holding write data input from the outside on the byte unit basis. The sense latch circuit 54 senses and latches stored information read from a nonvolatile memory cell and holds write control data for writing operation given from the data latch circuit 55.

Figure 23:
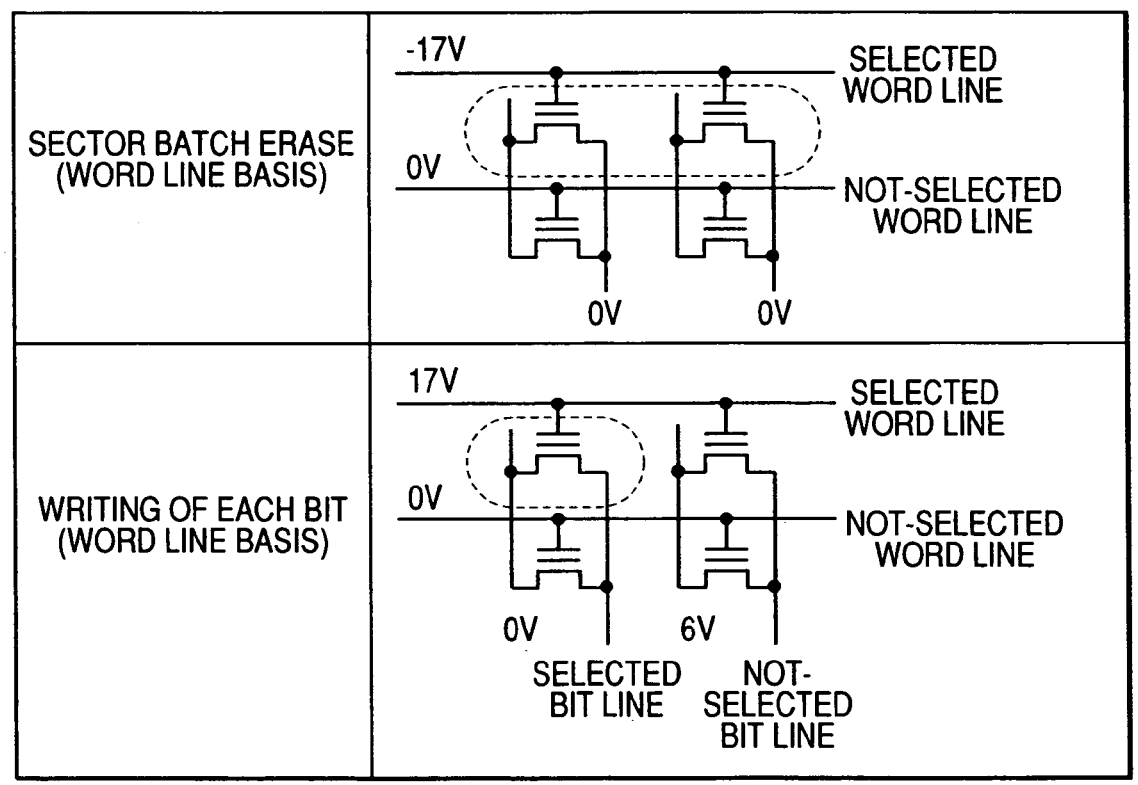
FIG. 23 is a diagram illustrating states of applying erase and write voltages to a memory cell.

Data in the memory cells is erased in a lump on a word line unit basis (which is a sector unit basis) as shown in FIG. 23. −17V is applied to a selected word line, 0V is applied to a not-selected word line, and 0V is applied to the source line.

As shown in FIG. 23, to write data into the memory cell, 17V is applied to a write selection word line, 0V is applied to a write selection bit line, and 6V is applied to a not-selected bit line. As the write high voltage application time increases, the threshold voltage of a memory cell rises. Either 0V or 6V is applied to a bit line is determined by the logic value of write control information to be latched by the sense latch circuit.

The reading operation on the memory cell is performed in such a manner that, although not limited, 3.2V is applied to a read selection word line, the source line is connected to the ground voltage of the circuit, 1.0V is applied to the bit line via the sense latch circuit, and stored information is read according to a change in the bit line potential based on the presence or absence of current flowing from the bit line to the source line in accordance with the threshold voltage of the memory cell.

The bit line selected by the Y address decoder 52 is connected to the data input/output control circuit 42. Connection between the data input/output control circuit 42 and the input/output terminal I/O[7:0] is controlled by the interface control unit 28.

The internal power source circuit 33 in FIG. 19 generates various operation powers for writing, erasing, verifying, reading, and the like and supplies them to the memory banks BNK1 and BNK2.

The command decoder 40 and the CPU 41 control the whole memory operation such as simultaneous writing on multiple banks using the multiple chips and interleave writing on multiple banks using the multiple chips in accordance with an access command (also simply called command) supplied from the interface control unit 28.

The command includes, although not limited, one or plural command codes and address information and data information necessary to execute the commands in a predetermined format. Data information such as write data included in a command is supplied to the data input/output control circuit 42. The address information included in the command is supplied to the address buffer 31 and, as necessary, to the address counter 32 as described above. The memory banks BNK1 and BNK2 are mapped to different memory addresses, and an X address signal supplied to the address buffer 31 is regarded as a sector address for designating one of sector regions in units of, for example, 2048 bits. Particularly, information as a part of the X address signal, for example, the uppermost address bit Am is regarded as memory bank designation information for instructing a memory bank to be subjected to the memory operation and supplied to the command decoder 40. The command decoder 40 instructs the CPU 41 to use the memory bank designated by memory bank designation information as an object of the memory operation. The Y address signal supplied to the address counter 32 designates the position on an 8-bit unit basis in the 2048-bit data of a sector address designated by the X address signal. In an initial state of the memory operation, the address counter 32 is reset to the initial value "0". When the Y address signal is supplied, the value is used as a preset value of the address counter 32. The Y address counter 32 uses the initial value or preset value as a start address and sequentially outputs the Y address signal sequentially incremented as necessary to the memory banks BNK1 and BNK2.

The command decoder 40 in FIG. 19 decodes a command code included in a command, determines a memory bank to operate by the memory bank designation information Am and supplies a result of decoding and a result of determination to the CPU 41. On the basis of the results, the CPU 41 supplies access control signal CNT1 and CNT2 to the memory banks BNK1 and BNK2 to operate and controls the operations of the memory banks BNK1 and BNK2. When the memory operation is erasing or writing, a high voltage is applied step by step, verifying operation is performed in each step, and verification result information VFY1 and VFY2 is returned to the CPU 41. When the verification result information VFY1 and VFY2 indicates that a required threshold voltage state has not been reached yet, if time is not up, the CPU 41 instructs application of a high voltage at the next step by the access control signals CNT1 and CNT2. When the verification result information VFY1 and VFY2 indicates that the required threshold voltage state has not been achieved yet even after time is up, the CPU 41 gives a fail status to the status registers 26 and 27 by fail/pass information FP1 and FP2. The command decoder 40 outputs operation mode information MD1 and MD2 adapted to an operation instructed by a command given at that time to the status registers 26 and 27. The status registers 26 and 27 determine the cause of fail or pass notified by the fail/pass information FP1 and FP2 by the operation mode information MD1 and MD2 and sets a fail or pass state in a corresponding register bit. The command decoder 40 inputs status information ST1 and ST2 held by the status registers 26 and 27 and, with reference to the information, determines whether a new input command can be accepted or not. For example, if the memory bank BNK1 is in a write fail state, an access command designating the memory bank BNK1 can be accepted only when the access command is a predetermined command such as a write retry command.

The status registers 26 and 27 hold information indicative of a status of a memory operation for each of memory banks. The information held by the two status registers 26 and 27 can be read from the input/output terminal I/O[7:0] by asserting the output enable signal /OE.

FIG. 24 illustrates access commands of the flash memory chip CHP1. The access commands are roughly divided into read operation commands A, an erase operation command B, write operation commands C, and status register resetting commands D. The diagram shows the command names, meaning, and basic command formats.

A first serial read command (Serial Read (1)) is a command for reading a data region in a sector. A second serial read command (Serial Read (2)) is a command for reading a management region of a sector. An ID read command (Read Identifier Codes) is a command for reading a silicon signature such as storage capacity or serial number of the flash memory chip. A first data recovery read command (Data Recovery Read (1)) instructs to output write data held in a memory bank which enters a write fail state in a writing operation on a memory bank to the outside. A second data recovery read command (Data Recovery Read (2)) instructs an operation of outputting write data held in the memory bank BNK1 which enters a write fail state during a writing operation on two memory banks to the outside. A third data recovery read command (Data Recovery Read (3)) instructs an operation of outputting write data held in the memory bank BNK2 which enters a write fail state during a writing operation on two memory banks to the outside. The data recovery commands are used to output write data held in a flash memory to the outside when a write fail occurs so that a host apparatus can write data to another flash memory.

The sector erase command (Sector Erase) instructs an erasing operation on a sector unit basis.

A first write command (Program(1)) instructs a writing operation including a sector erasing sequence. A second write command (Program(2)) instructs a writing operation on the data region in a sector. A third write command (Program(3)) instructs a writing operation on the management region in a sector. A fourth write command (Program (4)) instructs additional writing. The additional writing is a writing operation on a storage region or the like as a part of the management region. A program retry command ("Program Retry" command) instructs to retry a writing operation on another sector in the same memory bank when write fail occurs.

At the head of each of the various access commands, a command code such as "00H" expressed in hexadecimal notation is disposed. A command such as the ID read command (Read Identifier Codes) as a part of the commands is constructed by only a command code. In an access command requiring address information, sector address information SA1 and SA2 is disposed subsequent to the command code. The total number of bits of the sector address information SA1 and SA2 is 16. One sector address (X address information) is constructed by 16 bits. In case of reading or writing a part of a sector from some midpoint of the sector, it is sufficient to add Y address information after the sector address information. In the case where write data is necessary as in the writing operation, write data follows the Y address information.

In a sector erase command, a command code "B0H" instructs start of the erasing operation. As a command for instructing erasing of a sector in a memory bank, it is sufficient to add the command code "B0H" after the sector address information SA1 and SA2 to be erased. In the case of instructing erasing of sectors in parallel in two memory banks, it is sufficient to dispose second sector address information SA1·X·1 and SA2·X·1 subsequent to the first sector address information SA1 and SA2 and finally add the command code "B0H". Memory banks designated by the second sector address information SA1·X·1 and SA2·X·1 have to be different from memory banks designated by the first sector address information SA1 and SA2. No separator code is necessary between the first sector address information SA1 and SA2 and the second sector address information SA1·X·1 and SA2·X·1 for the reason that Y address information and data information is unnecessary to erase a sector.

In the first to fourth write access commands and the program retry command, a command code "40H" is a command code for instructing start of the writing operation. In the case of writing two memory banks in parallel, a command code "41H" is interposed as a separator code between instruction information such as addresses and write data to both of the memory banks BNK1 and BNK2. Since designation of a Y address (preset address into the address counter) is arbitrary in the writing operation, the separator code is necessary. The separator code "41H" may be regarded as a command code instructing parallel writing operation. In the writing operation, the memory banks designated by the second sector address information SA1·X·1 and SA2·X·1 have to be different from memory banks designated by the first sector address information SA1 and SA2. The 2-bank parallel write command is not an object of the interleave operation. In the program retry command, sector addresses SA1·X·3 and SA2·X·3 have to select banks failed to be written. Whether the limitation articles are fulfilled or not is determined by the command decoder 40.

The invention achieved by the inventors herein has been concretely described above on the basis of the embodiment. Obviously, the invention is not limited to the embodiment but can be variously modified without departing from the gist.

For example, the nonvolatile memory chip is not limited to a flash memory cell but may be an MNOS, a high-dielectric memory cell, or the like. Information stored in a memory cell is not limited to binary data but may be multivalue data such as four-value data. In the case of a memory cell capable of storing multivalue data, multivalue data is stored according to variations in the threshold voltages or by locally accumulating charges in a storage gate. The configuration of the memory cell array in the flash memory is not limited to the AND type but may be properly changed to the NOR type, the NAND type, or the like. The threshold voltages for erasing and writing operations can be also defined different from those of the specification.

The kinds of commands, methods of designating a sector address, a method of inputting write data, and the like may be different from the above. For example, the input terminals do not have to be dedicated to data, address and command. The number of memory banks is not limited to two but may be three or more.

Obviously, the form of the memory card is not limited to a multimedia card but the invention can be also applied to memory cards according to other standards An example of the memory cards is a memory card having a plurality of terminals for inputting/outputting data and capable of inputting/outputting data in parallel. The memory system is not limited to a memory card. As a part of a data processing system constructed by mounting a microprocessor, a memory, and the like onto a circuit board, a flash memory chip and a control chip may be mounted.

Effects obtained by representative ones of the inventions disclosed in the application will be briefly described as follows.

Since the simultaneous writing operation or the interleave writing operation on a plurality of memory banks in a plurality of nonvolatile memory chips can be selected, in the simultaneous writing operation, the writing operation much longer than setup time can be performed perfectly in parallel. In the interleave writing operation, the writing operation following the write setup can be performed so as to partially overlap the writing operation on another memory bank. As a result, the number of nonvolatile memory chips required to construct a memory system performing a high-speed writing process can be made relatively small. In short, the invention can provide a memory system and, further, a memory card of which writing speed can be increased without mounting a large number of flash memory chips to an extent that the size and cost of the memory card increases.

INDUSTRIAL APPLICABILITY

The invention can be widely applied to a memory card of a predetermined form such as a multimedia card, a processor board on which a flash memory and a microprocessor are mounted, and the like.

The invention claimed is:

1. A memory system comprising:
   a plurality of nonvolatile memory chips each having a plurality of memory banks which can perform a memory operation independent of each other; and
   a memory controller which can control to individually access each of said nonvolatile memory chips,
   wherein in the case of giving a write instruction designating an address to a nonvolatile memory chip and, after that, giving a write instruction designating another address to said nonvolatile memory chip, said memory controller can selectively instruct a simultaneous writing operation or an interleave writing operation, and
   wherein after giving a write instruction designating said another address to one of said plurality of nonvolatile memory chips, said memory controller can give a write instruction designating further another address to another nonvolatile memory chip in said plurality of nonvolatile memory chips.

2. The memory system according to claim 1, wherein said simultaneous writing operation is a
   writing operation started at the same timing on the plurality of memory banks after serial plural instructions of the writing operation designating the memory banks, and
   wherein said interleave writing operation is a writing operation of starting a new writing operation in response to a write instruction designating another memory bank during a writing operation which has already started.

3. The memory system according to claim 2, wherein said memory controller discriminates between an instruction of said simultaneous writing operation and an instruction of said interleave writing operation in accordance with a kind of a command code which accompanies write address information and write data information and instructs a writing operation.

4. The memory system according to claim 1,
   wherein each of said nonvolatile memory chips has a chip select terminal and other plural access terminals, and
   wherein said memory controller has a chip select signal output terminal individually coupled to said chip select terminal of each of the nonvolatile memory chips and a plurality of access information terminals commonly coupled to said access terminals of each of said nonvolatile memory chips.

5. A memory system comprising:
   a plurality of nonvolatile memory chips each having a plurality of memory banks which can perform a memory operation independent of each other; and
   a memory controller which can control to individually access each of said plurality of nonvolatile memory chips,
   wherein said memory controller can sequentially instruct interleave writing or simultaneous writing on the memory banks in each of said nonvolatile memory chips.

6. The memory system according to claim 5, wherein said interleave writing instruction is a writing operation instruction for starting a new writing operation in response to a write instruction designating another memory bank during a writing operation already started.

7. A memory system comprising:
   a plurality of nonvolatile memory chips each having a plurality of memory banks which can perform a memory operation independent of each other; and
   a memory controller which can control to individually access each of said nonvolatile memory chips,
   wherein said memory controller can sequentially instruct simultaneous writing on the memory banks in each of said nonvolatile memory chips.

8. The memory system according to claim 7, wherein said simultaneous writing instruction is a writing operation instruction for starting the writing operation at the same timing on a plurality of memory banks after serial plural instructions of the writing operation designating the memory banks.

9. A memory system comprising: a plurality of flash memory chips each having a plurality of memory banks which can perform a memory operation independent of each other;
a memory controller which can control to individually access each of said plurality of flash memory chips; and
an SRAM coupled to said memory controller,
wherein said SRAM can temporarily store write data to the flash memory chips, and
wherein said memory controller can select an instruction of sequentially performing interleave writing on the memory banks in each of the flash memory chips or an instruction of sequentially performing simultaneous writing the memory banks in each of the flash memory chips.

10. The memory system according to claim 9,
wherein said interleave write instruction is a writing operation instruction for starting a new writing operation in response to a write instruction designating another memory bank during a writing operation which has already started, and
wherein said simultaneous write instruction is a writing operation instruction for starting the writing operation at the same timing on the plurality of memory banks after serial plural instructions of the writing operation designating memory banks.

11. A memory system comprising:
a plurality of flash memory chips each having a plurality of memory banks which can perform a memory operation independent of each other; and
a memory controller which can control to access said flash memory chip by using an access command,
wherein said memory controller can select either a first control of outputting a first command code, address information of a memory bank subsequent to the first command code, and a second command code subsequent to the address information of the memory bank and making a memory bank in a flash memory chip designated by said address information start a memory operation every input of the second command code, or a second control of outputting a first command code, address information of a memory bank in a flash memory chip subsequent to the first command code, a third command code subsequent to the address information of the memory bank, address information of a memory bank in a flash memory chip subsequent to the third command code, and a second command code subsequent to the address information of the memory bank, and making a plurality of memory banks designated by a plurality of pieces of address information separated by said third command between said first command code and said second command code simultaneously start a memory operation in response to input of the second command code, and allow the plurality of flash memory chips perform the memory operation in a serial manner.

12. The memory system according to claim 11, wherein said first command code is a command code indicative of a kind of the writing operation, the second command code is a command code for instructing start of the writing operation, and the third command code is a command code indicating that address information follows.

13. A memory card comprising, on a card board:
an external terminal;
an external interface circuit coupled to said external terminal;
a memory controller coupled to said external interface circuit; and
a plurality of flash memory chips each subjected to an access control by said memory controller,
wherein said flash memory chip has a plurality of memory banks which can perform a memory operation independent of each other,
wherein in the case of giving a write instruction designating an address to a flash memory chip and, after that, giving a write instruction designating another address to said flash memory chip, said memory controller can selectively instruct a simultaneous writing operation or an interleave writing operation, and
wherein, after giving a write instruction designating said another address to one of said plurality of flash memory chips, said memory controller can give a write instruction designating further another address to another flash memory chip in said plurality of flash memory chips.

14. The memory card according to claim 13,
wherein said simultaneous writing operation is a writing operation started at the same timing on a plurality of memory banks after serial plural instructions of the writing operation designating the memory banks, and
wherein said interleave writing operation is a writing operation for starting a new writing operation in response to a write instruction designating another memory bank during a writing operation which has already started.

15. The memory card according to claim 14, wherein said memory controller discriminates between an instruction of said simultaneous writing operation and an instruction of said interleave writing operation in accordance with a kind of a command code which accompanies write address information and write data information and instructs a writing operation.

16. The memory card according to claim 15, further comprising an SRAM coupled to said memory controller,
wherein said SRAM can temporarily store write data to a flash memory chip.

17. The memory card according to claim 13, wherein said external terminals include a 1-bit data input/output terminal, a 1-bit command terminal, a power source voltage terminal, a circuit's ground voltage terminal, and a clock terminal.

18. A nonvolatile semiconductor memory device comprising:
a memory controller; and
a plurality of nonvolatile memories,
wherein said memory controller issues a write instruction command including address information indicative of an address in which information is to be written to said plurality of nonvolatile memories,
wherein said nonvolatile memory has a plurality of storage regions which are separated by addresses and can be accessed in parallel with another storage region, and
wherein said memory controller simultaneously issues write instruction commands designating different storage regions and, after that, can perform simultaneous writing for starting a writing operation on said designated plurality of memory regions at the same timing, on a plurality of nonvolatile memories in a serial manner.

19. The nonvolatile semiconductor memory device according to claim 18, wherein said nonvolatile memory has a plurality of memory cells, and wherein a writing operation of said nonvolatile memory is performed by selecting a group of memory cells in accordance with an address instructed by said write instruction command and changing a threshold voltage according to information to be written into each of the selected memory cells.

20. The nonvolatile semiconductor memory device according to claim 18, wherein the writing operation of said nonvolatile memory includes a first operation for changing the threshold voltage of a memory cell, and a second operation for confirming whether the threshold voltage of each of the memory cells has changed to a threshold voltage corresponding to said information to be written, and wherein in the case where the threshold voltage of at least one memory cell has not changed to a threshold voltage corresponding to the information to be written after said second operation, said first operation is performed.

21. The nonvolatile semiconductor memory device according to claim 20, wherein in said plurality of memory cells, a threshold voltage included in a threshold voltage distribution corresponding to information to be written out of three or more threshold voltage distributions is set.

* * * * *